(12) United States Patent
Yoon et al.

(10) Patent No.: US 12,062,577 B2
(45) Date of Patent: Aug. 13, 2024

(54) SEMICONDUCTOR DEVICE AND METHOD FOR FABRICATING THE SAME

(71) Applicant: SK hynix Inc., Gyeonggi-do (KR)

(72) Inventors: Jae Man Yoon, Gyeonggi-do (KR); Dae Ik Kim, Gyeonggi-do (KR); Hong Kyun Lee, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 82 days.

(21) Appl. No.: 17/878,640

(22) Filed: Aug. 1, 2022

(65) Prior Publication Data

US 2022/0367282 A1    Nov. 17, 2022

Related U.S. Application Data

(63) Continuation of application No. 17/153,247, filed on Jan. 20, 2021, now Pat. No. 11,437,282.

(30) Foreign Application Priority Data

Sep. 8, 2020    (KR) .................. 10-2020-0114438

(51) Int. Cl.
*H01L 21/8234* (2006.01)
*H01L 29/66* (2006.01)
*H01L 29/78* (2006.01)

(52) U.S. Cl.
CPC ......... *H01L 21/823468* (2013.01); *H01L 29/66712* (2013.01); *H01L 29/7813* (2013.01)

(58) Field of Classification Search
CPC ....... H01L 21/823468; H01L 29/66712; H01L 29/7813; H01L 21/76897; H01L 23/5386; H01L 21/28525; H10B 12/482; H10B 12/0335; H10B 12/02; H10B 12/30; H10B 12/03

See application file for complete search history.

(56) References Cited

U.S. PATENT DOCUMENTS

| | | | | |
|---|---|---|---|---|
| 9,209,241 | B2 * | 12/2015 | Kim | ............. H01L 29/0649 |
| 10,453,796 | B2 * | 10/2019 | Song | ............. H01L 27/10888 |
| 10,461,153 | B2 * | 10/2019 | Lee | ............. H01L 27/10894 |
| 10,468,350 | B2 * | 11/2019 | Kim | ............. H01L 27/10855 |
| 10,490,444 | B2 * | 11/2019 | Choi | ............. H01L 23/528 |
| 10,797,056 | B2 * | 10/2020 | Kim | ............. H10B 12/34 |
| 2009/0085083 | A1 * | 4/2009 | Shin | ............. H01L 21/76897 |
| | | | | 257/E29.345 |
| 2015/0061134 | A1 * | 3/2015 | Lee | ............. H01L 21/7682 |
| | | | | 257/751 |
| 2017/0005097 | A1 * | 1/2017 | Kim | ............. H01L 21/7682 |
| 2017/0154805 | A1 * | 6/2017 | Kim | ............. G11C 11/4091 |

(Continued)

*Primary Examiner* — Steven B Gauthier
*Assistant Examiner* — Khatib A Rahman
(74) *Attorney, Agent, or Firm* — IP & T GROUP LLP

(57) ABSTRACT

A method for fabricating a semiconductor device includes forming a bit line contact hole in a substrate; forming a first spacer on a sidewall of the bit line contact hole; forming a sacrificial spacer over the first spacer; forming a first conductive material that fills the bit line contact hole over the sacrificial spacer; forming a second conductive material over the first conductive material; forming a bit line by etching the second conductive material; and forming a bit line contact plug and a gap between the bit line contact plug and the first spacer by partially etching the first conductive material and the sacrificial spacer to be aligned with the bit line.

17 Claims, 27 Drawing Sheets

(56) References Cited

U.S. PATENT DOCUMENTS

| | | | | |
|---|---|---|---|---|
| 2017/0323893 | A1* | 11/2017 | Kim | H01L 27/10852 |
| 2018/0301459 | A1* | 10/2018 | Kim | B08B 7/0014 |
| 2019/0103302 | A1* | 4/2019 | Yoon | H10B 12/482 |
| 2019/0164975 | A1* | 5/2019 | Song | H01L 27/10888 |
| 2019/0296026 | A1* | 9/2019 | Ji | H10B 12/485 |
| 2020/0111795 | A1* | 4/2020 | Feng | H10B 12/0335 |
| 2021/0273048 | A1* | 9/2021 | Park | H01L 29/0649 |

* cited by examiner

SEMICONDUCTOR DEVICE AND METHOD FOR FABRICATING THE SAME

CROSS-REFERENCE TO RELATED APPLICATIONS

The present application is a continuation of U.S. patent application Ser. No. 17/153,247 filed on Jan. 20, 2021, which claims priority to Korean Patent Application No. 10-2020-0114438, filed on Sep. 8, 2020, which is incorporated herein by reference in its entirety.

BACKGROUND

1. Field

Various embodiments of the present disclosure relate to a semiconductor device and a method for fabricating the same, and more particularly, to a semiconductor device including a contact plug, a first spacer, and a second spacer, and a method for fabricating the semiconductor device.

2. Description of the Related Art

As the degree of integration of semiconductor devices increases, the area occupied by patterns is decreasing. Accordingly, when a contact plug is formed, a conductive material is not etched but remains, which may cause a short circuit defect with other neighboring contact plugs. Therefore, a method of forming a spacer surrounding the contact plug to prevent a short circuit defect has been suggested.

SUMMARY

Embodiments of the present disclosure are directed to a semiconductor device including a first spacer and a second spacer capable of preventing a short circuit defect of a contact plug, and a method for fabricating the semiconductor device.

In accordance with an embodiment of the present disclosure, a method for fabricating a semiconductor device includes: forming a bit line contact hole in a substrate; forming a first spacer on a sidewall of the bit line contact hole; forming a sacrificial spacer over the first spacer; forming a first conductive material that fills the bit line contact hole over the sacrificial spacer; forming a second conductive material over the first conductive material; forming a bit line by etching the second conductive material; and forming a bit line contact plug and a gap between the bit line contact plug and the first spacer by partially etching the first conductive material and the sacrificial spacer to be aligned with the bit line.

In accordance with an embodiment of the present disclosure, a method for fabricating a semiconductor device further includes: forming an opening in a substrate; forming a first spacer on a sidewall of the opening; forming a silicon germanium layer (SiGe) over the first spacer; forming a polysilicon layer that fills the opening over the silicon germanium layer (SiGe); forming a contact plug and a gap which is positioned between the contact plug and the first spacer by partially etching the polysilicon layer and the silicon germanium layer (SiGe); and cleaning the gap to expand the gap.

In accordance with an embodiment of the present disclosure, a semiconductor device includes: a bit line structure including a bit line contact plug over a substrate and a bit line over the bit line contact plug; a storage node contact plug formed over the substrate spaced apart from the bit line structure in a first direction; a first spacer between the bit line structure and the storage node contact plug; and a pair of second spacers formed at both ends of the bit line contact plug in a second direction that is perpendicular to the first direction.

DETAILED DESCRIPTION

Figure 1A:
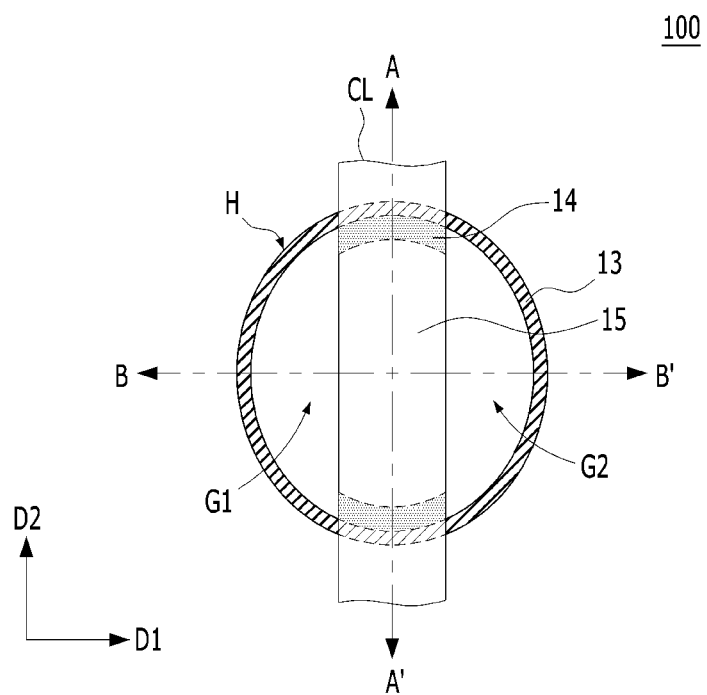
FIG. 1A is a top view illustrating a portion of a semiconductor device in accordance with an embodiment of the present invention.

Various embodiments of the present disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present disclosure to those skilled in the art. Throughout the disclosure, like reference numerals refer to like parts throughout the various figures and embodiments of the present disclosure.

The drawings are not necessarily to scale and in some instances, proportions may have been exaggerated to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

Figure 1B:
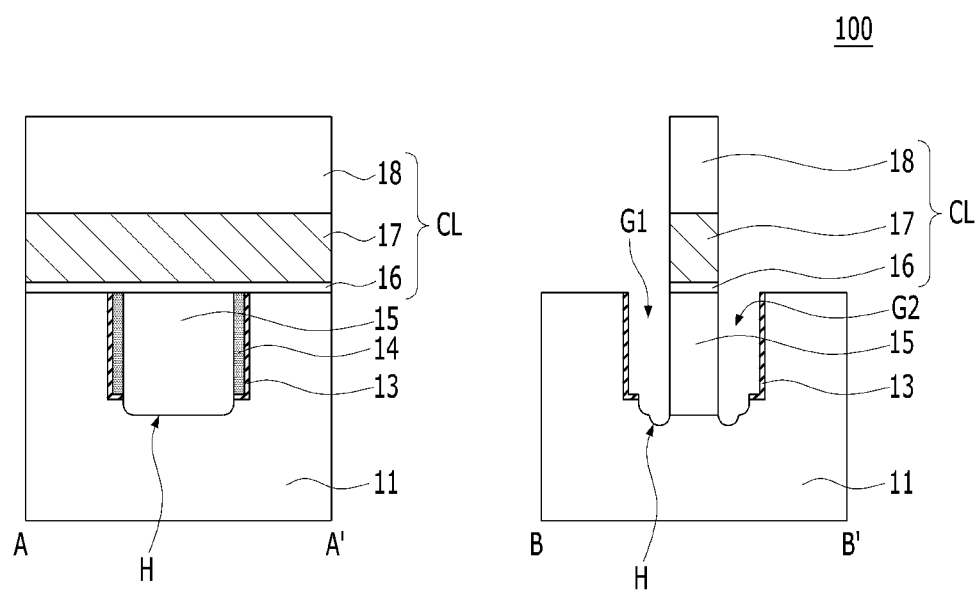
FIG. 1B shows cross-sectional views illustrating a semiconductor device in accordance with an embodiment of the present disclosure.

FIGS. 1A to 1B illustrate a semiconductor device 100 in accordance with an embodiment of the present disclosure. FIG. 1A is a top-view of the semiconductor device 100 in accordance with an embodiment of the present disclosure. FIG. 1B shows cross-sectional views taken along lines A-A' and B-B' of FIG. 1A.

According to FIGS. 1A and 1B, a substrate 11 may be prepared. The substrate 11 may include a semiconductor substrate. The substrate 11 may be formed, for example, of a silicon-containing material. The substrate 11 may include, for example, silicon, monocrystalline silicon, polysilicon, amorphous silicon, silicon germanium, monocrystalline silicon germanium, polycrystalline silicon germanium, carbondoped silicon, a combination thereof, or a multiple layer thereof. The substrate 11 may also include other semiconductor materials such as germanium. The substrate 11 may include a III-V group semiconductor substrate, for example, a compound semiconductor substrate such as GaAs. The substrate 11 may include a Silicon-On-Insulator (SOI) substrate.

A contact hole H may be formed in the substrate 11. The contact hole H may also be referred to as opening H. The top view of the contact hole H may be elliptical, for example, a circle. The top view of the contact hole H may be an oval.

Contact plug 15 may be positioned in the contact hole H. The contact plug 15 may be positioned in the substrate 11. The contact plug 15 may be buried in the substrate 11. The contact plug 15 may directly contact the substrate 11. The contact plug 15 may fill a portion of the contact hole H. The upper surface of the contact plug 15 may be positioned at the same level as the upper surface of the substrate 11. The contact plug 15 may include a semiconductor material. The contact plug 15 may include a silicon-containing material. The contact plug 15 may include polysilicon, according to an embodiment. Polysilicon may be doped with a dopant. The contact plug 15 may be formed of a semiconductor material doped with an impurity, a metal, a conductive metal nitride, or a combination thereof. According to an embodiment, the contact plug 15 may be formed by Selective Epitaxial Growth (SEG).

A pair of gaps G1 and G2 may be formed in the contact hole H with the contact plug 15 interposed therebetween. The pair of gaps G1 and G2 may be facing each other in a first direction D1 with the contact plug 15 interposed therebetween. The pair of gaps G1 and G2 may be symmetrical with the contact plug 15 interposed therebetween. The bottom surfaces of the pair of gaps G1 and G2 may be positioned at a lower level than the bottom surface of the contact plug 15. A portion of the substrate 11 may be exposed by the pair of gaps G1 and G2.

A conductive line structure CL may be positioned on the contact plug 15. The conductive line structure CL may include a barrier metal layer 16 formed on the contact plug 15, a conductive line 17 formed on the barrier metal layer 16, and a conductive line hard mask layer 18 formed on the conductive line 17. The conductive line structure CL may include a line shape crossing the contact hole H. The conductive line structure CL may extend in a line shape. The conductive line structure CL may extend in one direction while covering the contact plug 15. The line widths of the contact plug 15, the barrier metal layer 16, the conductive line 17, and the conductive line hard mask layer 18 may be the same. The bit line structure may be an example of the conductive line structure CL.

The barrier metal layer 16 may be formed on the contact plug 15 to be in direct contact with the contact plug 15. The barrier metal layer 16 may include, for example, a metal or a metal nitride. The barrier metal layer 16 may include, for example, titanium nitride (TiN), tantalum nitride (TaN), tungsten nitride (WN), or a combination thereof. According to an embodiment, the barrier metal layer 16 may be omitted.

The conductive line 17 may be formed on the barrier metal layer 16 to be in direct contact with the barrier metal layer 16. The conductive line 17 may be formed to include a single layer, a double layer, or a stacked structure of a plurality of three or more layers. The conductive line 17 may include a material having a lower specific resistance than the contact plug 15. The conductive line 17 may include, for example, a metal material having a lower specific resistance than the contact plug 15. The conductive line 17 may include, for example, a metal, a metal nitride, a metal silicide, or a combination thereof. The conductive line 17 may include, for example, tungsten-containing material. The conductive line 17 may include, for example, tungsten (W) or a tungsten compound. The conductive line 17 may be formed, in an embodiment, by stacking a tungsten silicide layer, a tungsten nitride layer, and a tungsten layer. When the conductive line 17 has a stacked structure of a plurality of layers, the lower conductive layer may include conductive polysilicon, and the middle conductive layer and the upper conductive layer may be formed of TiN, TiSiN, W, tungsten silicide, or a combination thereof, individually. For example, the middle conductive layer may be formed of TiN, TiSiN, or a combination thereof, and the upper conductive layer may be formed of tungsten (W).

The conductive line hard mask layer 18 may be formed on the conductive line 17 to be in direct contact with the conductive line 17. The thickness of the conductive line hard mask layer 18 may be greater than the thickness of the conductive line 17. The conductive line hard mask layer 18 may be formed of a dielectric material. The conductive line hard mask layer 18 may be formed of a material having an etch selectivity with respect to the conductive line 17. The conductive line hard mask layer 18 may include, for example, silicon oxide, silicon nitride, silicon oxynitride, or a combination thereof. According to an embodiment, the conductive line hard mask layer 18 may be formed of silicon nitride.

A first spacer 13 may be formed to be positioned on a sidewall of the contact hole H. The contact plug 15, the pair of gaps G1 and G2, and the first spacer 13 may be laterally arranged in the first direction D1. The first spacer 13 may include a ring-shape surrounding the sidewall of the contact hole H. The first spacer 13 may partially overlap with the conductive line structure CL. The first spacer 13 may include a dielectric material. The first spacer 13 may include, for example, an oxide a nitride, or a combination thereof. The first spacer 13 may include, for example, silicon oxide, silicon nitride, silicon oxynitride, or a combination thereof. According to an embodiment, the first spacer 13 may be formed of silicon oxide. The first spacer 13 may be formed by a Chemical Vapor Deposition (CVD) method or an Atomic Layer Deposition (ALD) method.

A second spacer 14 may be positioned on the first spacer 13. The second spacer 14 may not overlap with the pair of gaps G1 and G2. The second spacer 14 may be positioned between the contact plug 15 and the first spacer 13. The second spacer 14 may directly contact the contact plug 15. The second spacer 14 may be positioned at the end of the contact plug 15 in a second direction D2 which is perpendicular to the first direction D1. The second spacer 14 may be a pair of spacers positioned at both opposite ends of the contact plug 15 in the second direction D2. The contact plug 15, the second spacer 14, and the first spacer 13 may be laterally arranged in the second direction D2. The conductive line structure CL may be positioned over the second spacer 14. The thickness of the second spacer 14 may be thicker than the thickness of the first spacer 13. The second spacer 14 may include a material having a higher etching rate than the first spacer 13. The second spacer 14 may be formed of or include a silicon-containing material. The second spacer 14 may be formed of or include amorphous silicon (Si), polysilicon (Poly Si), undoped-polysilicon (undoped-Poly Si) or silicon germanium (SiGe). The second spacer 14 may include, for example, a metal nitride. For example, the second spacer 14 include, for example, titanium nitride (TiN).

According to the above-described embodiment, by forming the first spacer 13, the dopant of the contact plug 15 may not flow into the substrate 11. Therefore, property defects of the semiconductor device which are caused by dopant flowing into the substrate 11 may be eliminated. Also, by forming the second spacer 14, the first spacer 13 may be protected. When the conductive line structure CL is formed with the second spacer 14, the etching rate may be increased. As the second spacer 14 includes amorphous silicon (Amorphous Si), undoped-polysilicon (undoped-Poly Si), silicon germanium (SiGe), titanium nitride (TiN), or a combination thereof, a portion not overlapping with the conductive line structure CL may be reduced. As a result, short circuit defects of the contact plug 15 may be improved.

FIGS. 2A to 2E are cross-sectional views illustrating a method for fabricating the semiconductor device 100 in accordance with an embodiment of the present disclosure. FIGS. 2A to 2E are cross-sectional views taken along lines A-A' and B-B' of FIG. 1.

Figure 2A:
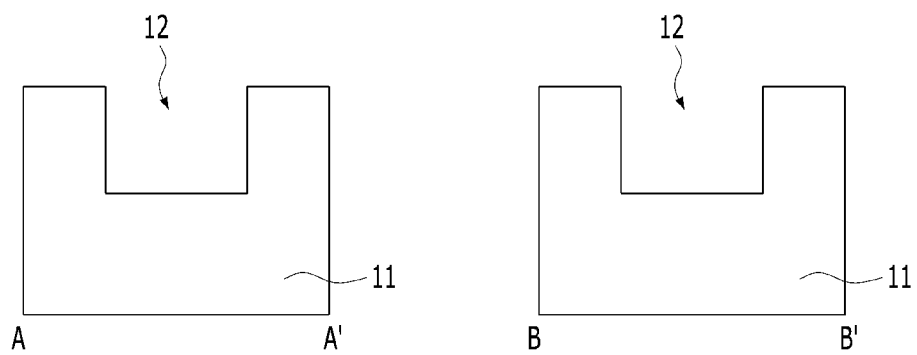
FIGS. 2A to 2E are cross-sectional views illustrating a method for fabricating a semiconductor device in accordance with an embodiment of the present disclosure.

Referring to FIG. 2A, a substrate 11 may be prepared. The substrate 11 may include a semiconductor substrate. The substrate 11 may include a silicon-containing material but the substrate may not be limited in this way. For example, the substrate 11 may also include other semiconductor materials such as germanium. The substrate 11 may include a III-V group semiconductor substrate. For example, the substrate 11 may include a compound semiconductor substrate, such as GaAs. The substrate 11 may include a Silicon-On-Insulator (SOI) substrate.

Optionally, an inter-layer dielectric layer (not shown) may be further included over the substrate 11. The inter-layer dielectric layer (not shown) may include, for example, silicon oxide, silicon nitride, a low-k material, or a combination thereof. The inter-layer dielectric layer (not shown) may include one or more layers. The inter-layer dielectric layer (not shown) may include one or more layers formed of different materials.

An opening 12 may be formed in the substrate 11. The opening 12 may be referred to as a 'contact hole'. The top-view of the opening 12 may be elliptical, for example, a circle or an oval.

Figure 2B:
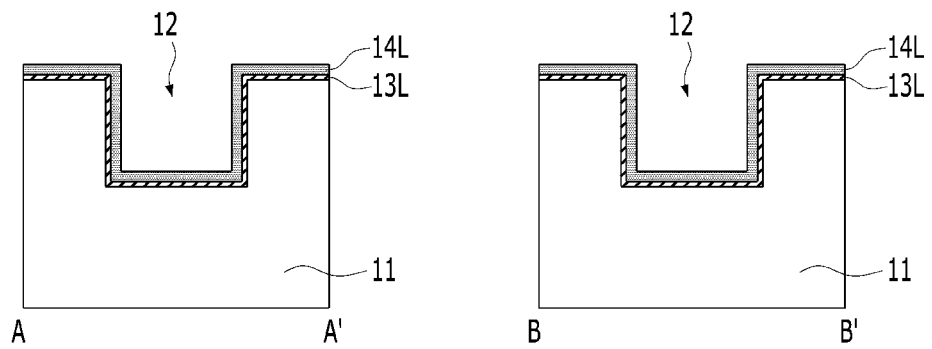

Referring to FIG. 2B, a preliminary first spacer 13L may be formed in the opening 12. The preliminary first spacer 13L may cover the substrate 11. The preliminary first spacer 13L may cover the bottom surface and the sidewall of the opening 12. The preliminary first spacer 13L may include a dielectric material. The first preliminary spacer 13L may include, for example, an oxide a nitride, or a combination thereof. The preliminary first spacer 13L may include, for example, silicon oxide, silicon nitride, silicon oxynitride, or a combination thereof. According to an embodiment, the preliminary first spacer 13L may be formed of silicon oxide. The first preliminary spacer 13L may be formed by a chemical vapor deposition (CVD) method or an atomic layer deposition (ALD) method.

A preliminary sacrificial spacer 14L may be formed over the preliminary first spacer 13L. The preliminary sacrificial spacer 14L may cover the preliminary first spacer 13L. The thickness of the preliminary sacrificial spacer 14L may be thicker than the thickness of the preliminary first spacer 13L. The preliminary sacrificial spacer 14L may be formed in the opening 12. The preliminary sacrificial spacer 14L may include a material having a higher etching rate than the preliminary first spacer 13L. The preliminary sacrificial spacer 14L may be formed of or include a silicon-containing material. The preliminary sacrificial spacer 14L may be formed of or include amorphous silicon (Si), polysilicon (Poly Si), undoped-polysilicon (undoped-Poly Si) or silicon germanium (SiGe). When the preliminary sacrificial spacer 14L includes silicon germanium (SiGe), it may be referred to as a 'silicon germanium (SiGe) layer'. The preliminary sacrificial spacer 14L may contain a metal nitride. For example, the preliminary sacrificial spacer 14L may include, for example, titanium nitride (TiN).

Figure 2C:
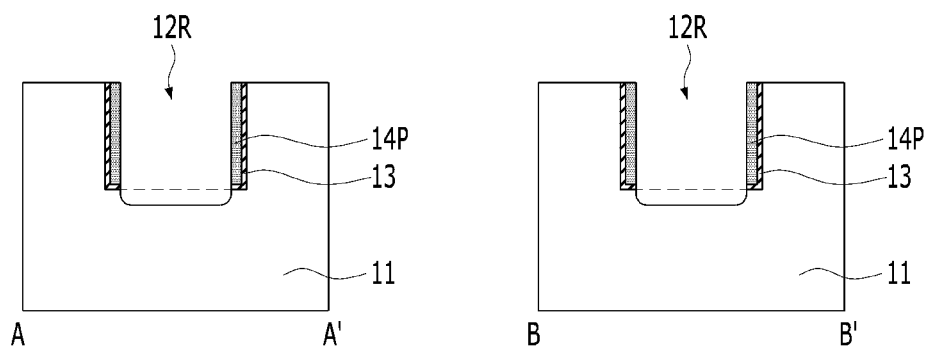

Referring to FIG. 2C, the preliminary sacrificial spacer 14L may be etched to form the sacrificial spacer 14P. The first spacer 13 may be formed by etching the preliminary first spacer 13L. As the first spacer 13 and the sacrificial spacer 14P are formed, a portion of the substrate 11 may be exposed. As the first spacer 13 and the sacrificial spacer 14P are formed, the top and bottom surfaces of the substrate 11 may be exposed. The first spacer 13 may include a ring-shape surrounding the sidewall of the opening 12. The first spacer 13 may have a surrounding-shape surrounding the sidewall of the opening 12. The sacrificial spacer 14P may cover the sidewall of the opening 12 over the first spacer 13. From the perspective of a top view, the first spacer 13 and the sacrificial spacer 14P may have a ring-shape.

As the first spacer 13 and the sacrificial spacer 14P are formed, the bottom surface of the opening 12 may be exposed. The surface of the substrate 11 exposed in the inside of the opening 12 may be further expanded by using the first spacer 13 and the sacrificial spacer 14P. The substrate 11 exposed inside the opening 12 may be additionally recessed by using the first spacer 13 and the sacrificial spacer 14P. The surface of the substrate 11 exposed in the inside of the opening 12 may be additionally etched by using the first spacer 13 and the sacrificial spacer 14P. As a result, a recessed opening 12R may be formed. As the recessed opening 12R is formed, the bottom surface of the recessed opening 12R may be positioned at a lower level than the bottom surfaces of the first spacer 13 and the sacrificial spacer 14P.

Figure 2D:
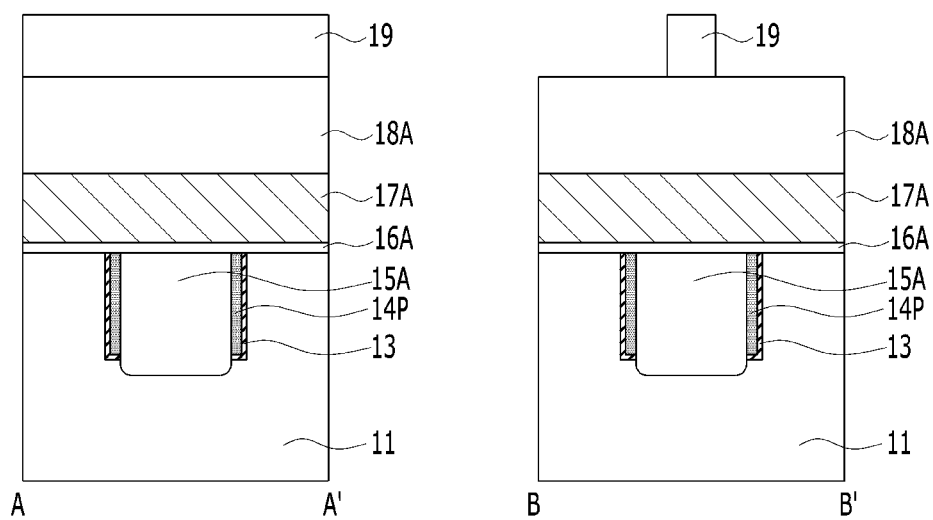

Referring to FIG. 2D, a first conductive material 15A may be formed in the recessed opening 12R. The first conductive material 15A may fill the recessed opening 12R. After forming a preliminary first conductive material layer (not shown) covering the substrate 11 to form the first conductive material 15A, a process of planarizing a preliminary first conductive material layer (not shown) to expose the upper surface of the substrate 11 may be included. The upper surface of the first conductive material 15A may be positioned at the same level as the upper surface of the substrate 11.

The first conductive material 15A may include a semiconductor material. The first conductive material 15A may include a conductive material. The first conductive material 15A may include a silicon-containing material. The first conductive material 15A may include polysilicon, according to an embodiment. Polysilicon may be implanted with a dopant. The first conductive material 15A may include doped-silicon (Doped-Si). The first conductive material 15A may be formed of a semiconductor material doped with an impurity, a metal, a conductive metal nitride, or a combination thereof. The first conductive material 15A may also be referred to as a 'polysilicon layer'. According to an embodiment, the first conductive material 15A may be formed by Selective Epitaxial Growth (SEG).

A preliminary barrier metal layer 16A may be formed over the first conductive material 15A and the substrate 11. The preliminary barrier metal layer 16A may include, for example, a metal or a metal nitride. The preliminary barrier metal layer 16A may include, for example, titanium nitride (TiN), tantalum nitride (TaN), tungsten nitride (WN), or a combination thereof.

A second conductive material 17A may be formed over the preliminary barrier metal layer 16A. The second conductive material 17A may include a single layer, a double layer, or a stacked structure of three or more layers. The second conductive material 17A may include a material having a lower specific resistance than the first conductive material 15A. The second conductive material 17A may include, for example, a metal material having a lower specific resistance than the first conductive material 15A. The second conductive material 17A may include, for example, a metal, a metal nitride, a metal silicide, or a combination thereof. The second conductive material 17A may include, for example, tungsten-containing material containing tungsten as a main component. For example, the second conductive material 17A may be formed, in an embodiment, by stacking a tungsten silicide layer, a tungsten nitride layer, and a tungsten layer. The second conductive material 17A may include, for example, tungsten (W) or a tungsten compound.

A preliminary conductive line hard mask layer 18A may be formed over the second conductive material 17A. The preliminary conductive line hard mask layer 18A may be formed of a dielectric material. The preliminary conductive line hard mask layer 18A may include a material having an etching selectivity with respect to the second conductive material 17A. The preliminary conductive line hard mask layer 18A may include, for example, silicon oxide, silicon nitride, silicon oxynitride, or a combination thereof. According to an embodiment, the preliminary conductive line hard mask layer 18A may be formed of silicon nitride.

A conductive line mask 19 may be formed on the preliminary conductive line hard mask layer 18A. The conductive line mask 19 may include a photoresist pattern. The conductive line mask 19 may have a line shape extending in one direction. The line width of the conductive line mask 19 may be smaller than the diameter of the bottom surface of the first conductive material 15A.

Figure 2E:
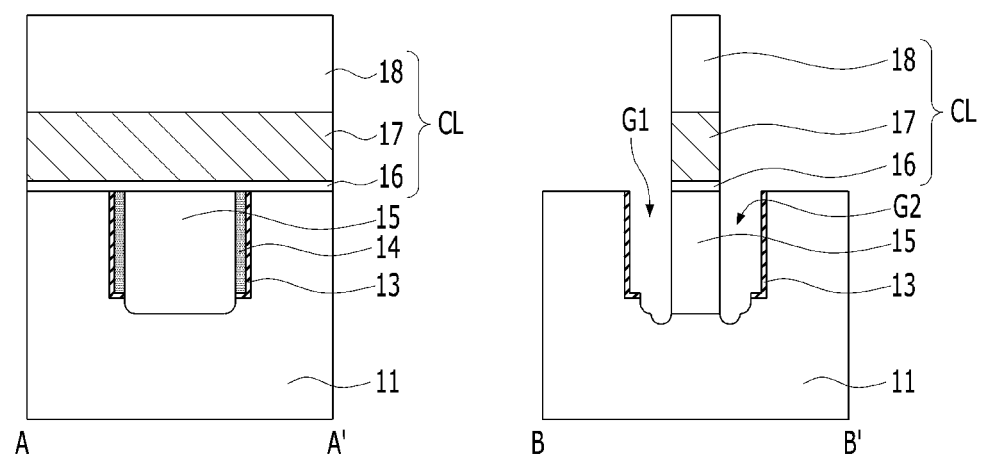

Referring to FIG. 2E, a conductive line structure CL may be formed. The conductive line structure CL may include a barrier metal layer 16, a conductive line 17, and a conductive line hard mask layer 18. A bit line structure may be an example of the conductive line structure CL.

The preliminary conductive line hard mask layer 18A may be etched by using the conductive line mask 19 as an etching mask. As a result, the conductive line hard mask layer 18 may be formed. The second conductive material 17A, the preliminary barrier metal layer 16A, and the first conductive material 15A may be etched by using the conductive line hard mask layer 18 as an etching mask. As a result, the conductive line 17, the barrier metal layer 16, and the contact plug 15 may be formed. The conductive line hard mask layer 18, the conductive line 17, the barrier metal layer 16, and the contact plug 15 may have the same line widths. The conductive line 17 may extend in one direction while covering the contact plug 15. The conductive line 17 may extend in a line shape.

As the contact plug 15 is formed, a portion of the sacrificial spacer 14P may be removed. As a result, the second spacer 14 may be formed. That is, the second spacer 14 may include the remaining portion of the sacrificial spacer 14P. The second spacer 14 may be formed by cutting the sacrificial spacer 14P. The second spacer 14 may cover the non-exposed sidewall of the contact plug 15. The second spacer 14 may cover a portion of the first spacer 13. The second spacer 14 may be formed between the contact plug 15 and the first spacer 13. The contact plug 15, the second spacer 14, and the first spacer 13 may be laterally arranged in the second direction D2 of FIG. 1. The second spacer 14 may be formed as a pair of second spacers facing each other in the second direction D2 with the contact plug 15 interposed therebetween. The second spacer 14 may be symmetrical or asymmetrical with the contact plug 15 interposed therebetween. The second spacer 14 may directly contact the first spacer 13. The second spacer 14 may directly contact the contact plug 15. When the contact plug 15 is formed, the second spacer 14 may protect the first spacer 13. Therefore, the first spacer 13 may remain without being etched.

As the contact plug 15 is formed, gaps G1 and G2 may be formed in a space from which a portion of the first conductive material 15A and a portion of the sacrificial spacer 14P are removed. As the contact plug 15 is etched, a pair of gaps G1 and G2 may be formed on both sidewalls of the contact plug 15. The pair of gaps G1 and G2 may be formed as a pair facing each other in the first direction D1 of FIG. 1 with the contact plug 15 therebetween. The first direction D1 and the second direction D2 may intersect with each other. The pair of gaps G1 and G2 may be independently formed on both sidewalls of the contact plug 15 without connecting with each other. The pair of gaps G1 and G2 may be isolated from each other by the contact plug 15. The pair of gaps G1 and G2 may be symmetrical or asymmetrical with the contact plug 15 interposed therebetween. The pair of gaps G1 and G2 may not overlap with the second spacer 14. The substrate 11 exposed by the pair of gaps G1 and G2 may be additionally recessed so that the lower surfaces of the gaps G1 and G2 may be lower than the bottom surface of the contact plug. When the contact plug 15 is formed, the areas of the gaps G1 and G2 may be secured as a portion of the sacrificial spacer 14P which is removed. Therefore, it is possible to reduce the short circuit defect of the contact plug 15.

Subsequently, a cleaning process using a wet chemical may be performed to expand the volume of the gaps G1 and G2. As the cleaning process is performed, the remaining amount of the sacrificial spacer 14P may be reduced. Accordingly, the linear length of the second spacer 14 in the first direction D1 may be the same as the linear length of the contact plug 15 in the first direction D1. When the second spacer 14 contains silicon germanium (SiGe), the linear length of the second spacer 14 formed by the cleaning process in the first direction D1 may be smaller than that in the case of containing other materials. That is, more of the sacrificial spacer 14P may be removed by the cleaning process. By forming the pair of gaps G1 and G2 to have a large volume, short circuit defects of the contact plug 15 may be reduced significantly.

According to the above-described embodiment, by forming the first spacer 13, the dopant of the contact plug 15 may not flow into the substrate 11. Accordingly, property defects of the semiconductor device that may be caused by the dopant flowing into the substrate 11 may be removed. When the conductive line structure CL is formed, the first spacer 13 may prevent the substrate 11 from being further etched. Therefore, the pair of gaps G1 and G2 may be filled without voids in a subsequent process.

When the conductive line structure CL is formed, the sacrificial spacer 14P may protect the first spacer 13. When the conductive line structure CL is formed, the sacrificial spacer 14P may increase the etching rate. Also, since the sacrificial spacer 14P is selectively removed in the subsequent cleaning process, the pair of gaps G1 and G2 may be formed larger. Accordingly, since the second spacer 14 remains only in an area overlapping with the conductive line structure CL, a short circuit defect of the contact plug 15 may be improved.

FIGS. 3A to 3H are top-views illustrating a portion of a semiconductor device in accordance with an embodiment of the present disclosure. FIGS. 3A to 3H show a modified example of FIG. 1A. Modified examples may be similar to the semiconductor device 100 of FIGS. 1A to 1B. The constituent elements of FIGS. 3A to 3H also appearing in the semiconductor device 100 of FIGS. 1A to 1B may have the same reference numerals. Hereinafter, detailed descriptions on the constituent elements also appearing in the semiconductor device 100 of FIGS. 1A to 1B may be omitted.

The semiconductor device according to FIGS. 3A to 3H may be formed by the fabrication method according to FIGS. 2A to 2E. In particular, referring to FIG. 2D, the position of the conductive line structure CL may be changed according to the conductive line mask 19 for forming the conductive line structure CL. The conductive line structure CL may have a shape extending while passing through the center of the first spacer 13 as illustrated in FIG. 1A. According to an embodiment, it may have a shape that extends past the right or left side of the first spacer 13. Also, referring to FIG. 2E, volumes of a pair of gaps G1 and G2 may vary according to an amount of the sacrificial spacer 14P that is removed. The volumes of the gaps G1 and G2 may vary depending on the material forming the sacrificial spacer 14P, the chemical used in the cleaning process, and the amount of etching the sacrificial spacer 14P when the conductive line structure CL is formed. For example, when the sacrificial spacer 14P includes silicon germanium (SiGe), more of the sacrificial spacer 14P may be removed through a cleaning process than when including other materials. Accordingly, the second spacer 14 may completely overlap with the conductive line structure CL. Hereinafter, specific embodiments will be described.

Figure 3A:
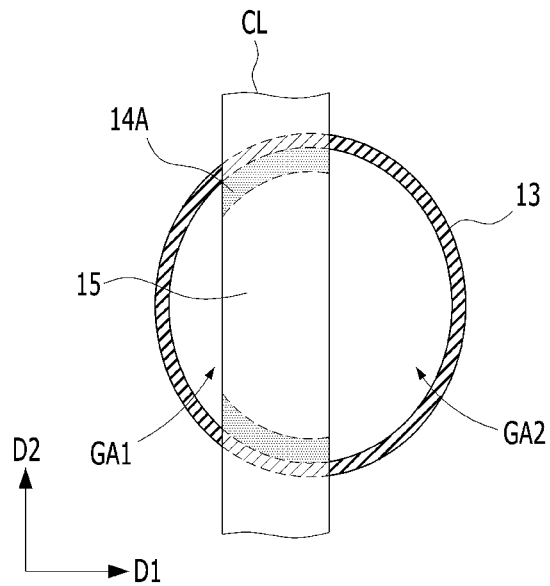
FIGS. 3A to 3H are top-views illustrating a portion of a semiconductor device in accordance with an embodiment of the present disclosure.

Referring to FIG. 3A, the second spacer 14A may fully overlap with the conductive line structure CL. The second spacer 14A may be positioned only under the conductive line structure CL. The conductive line structure CL may include a line shape extending along the second direction D2 and is moved to the left from the center of the first spacer 13. Accordingly, a pair of gaps GA1 and GA2 formed with the contact plug 15 interposed therebetween may be formed asymmetrically. For example, the volumes of the pair of gaps GA1 and GA2 may be different with the volume of the gap GA1 being smaller than the volume of the gap GA2.

Figure 3B:
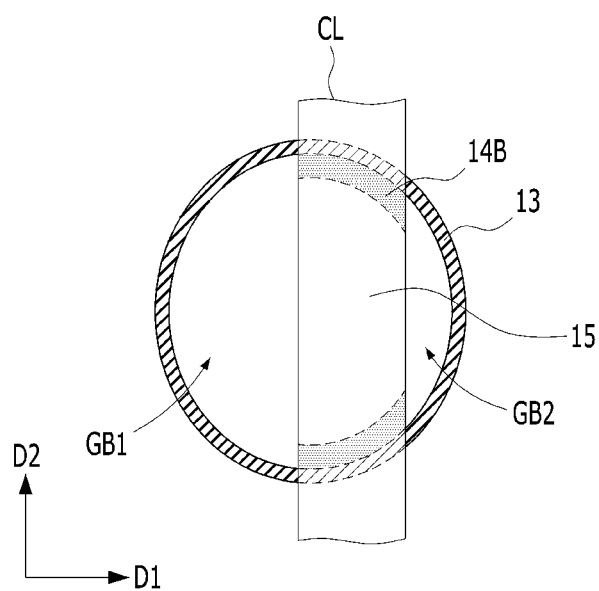

Referring to FIG. 3B, the second spacer 14B may fully overlap with the conductive line structure CL. The second spacer 14B may be positioned only under the conductive line structure CL. The conductive line structure CL may include a line shape that extends along the second direction D2 and is moved to the right from the center of the first spacer 13. Accordingly, a pair of gaps GB1 and GB2 formed with the contact plug 15 interposed therebetween may be formed asymmetrically. For example, the volumes of the pair of gaps GB1 and GB2 may be different with the volume of gap GB2 being smaller than the volume of gap GB1.

Figure 3C:
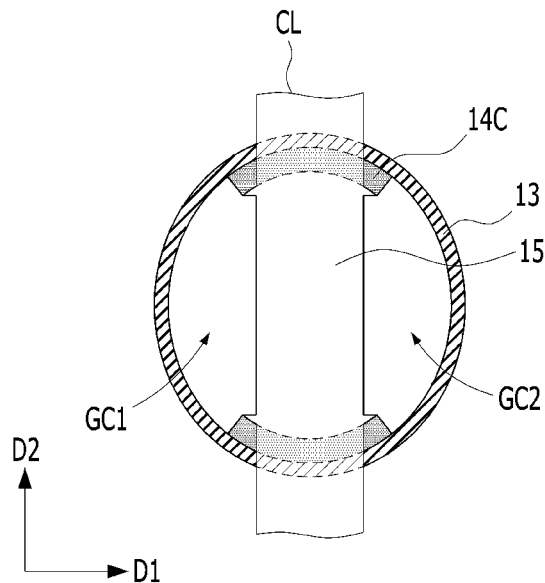

Referring to FIG. 3C, the second spacer 14C may partially overlap with the conductive line structure CL. The contact plug 15 may partially overlap with the conductive line structure CL. The second spacer 14C may remain without being removed during a cleaning process after the conductive line structure CL is formed. The second spacer 14C may have more sacrificial spacers remaining than the second spacer 14 of FIG. 1A. The second spacer 14C may be formed between the first spacer 13 and the contact plug 15. The conductive line structure CL may include a line shape extending along the second direction D2 while passing through the center of the first spacer 13. Accordingly, a pair of gaps GC1 and GC2 formed with the contact plug 15 interposed therebetween may be symmetrically formed. For example, the pair of gaps GC1 and GC2 may be the same volume.

Figure 3D:
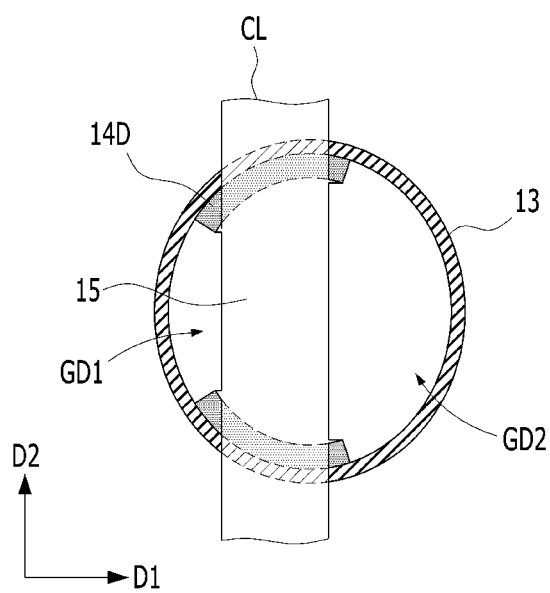

Referring to FIG. 3D, the second spacer 14D may partially overlap with the conductive line structure CL. The contact plug 15 may partially overlap with the conductive line structure CL. The second spacer 14D may remain without being removed during a cleaning process after the conductive line structure CL is formed. The second spacer 14D may have more sacrificial spacer remaining than the second spacer 14A of FIG. 3A. The second spacer 14D may be formed between the first spacer 13 and the contact plug 15. The conductive line structure CL may include a line shape that extends along the second direction D2 and is moved to the left from the center of the first spacer 13. Accordingly, a pair of gaps GD1 and GD2 formed with the contact plug 15 interposed therebetween may be formed asymmetrically. For example, the volumes of the pair of gaps GD1 and GD2 may be different with that of GD1 being smaller than that of GD2.

Figure 3E:
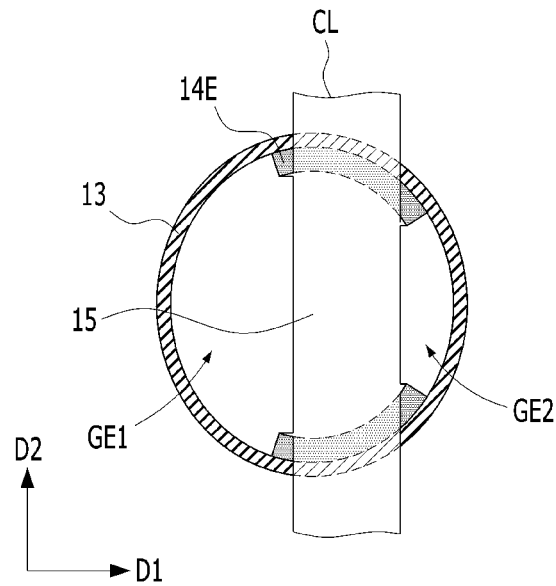

Referring to FIG. 3E, the second spacer 14E may partially overlap with the conductive line structure CL. The contact plug 15 may partially overlap with the conductive line structure CL. The second spacer 14E may remain without being removed during a cleaning process after the conductive line structure CL is formed. The second spacer 14E may have more sacrificial spacer remaining than the second spacer 14B of FIG. 3B. The second spacer 14E may be formed between the first spacer 13 and the contact plug 15. The conductive line structure CL may include a line shape that extends along the second direction D2 and is moved to the right from the center of the first spacer 13. Accordingly, a pair of gaps GE1 and GE2 formed with the contact plug 15 interposed therebetween may be formed asymmetrically. For example, the volumes of the pair of gaps GE1 and GE2 may be different.

Figure 3F:
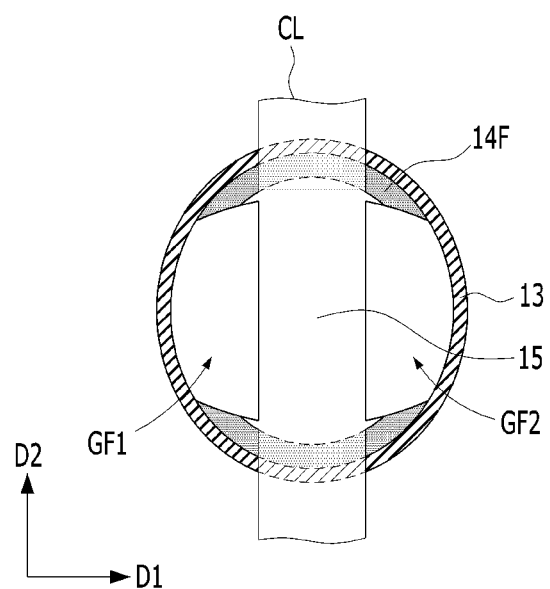

Referring to FIG. 3F, the second spacer 14F may partially overlap with the conductive line structure CL. The contact plug 15 may partially overlap with the conductive line structure CL. The second spacer 14F may remain without being removed in a cleaning process after the conductive line structure CL is formed. The second spacer 14F may have more sacrificial spacer remaining than the second spacer 14C of FIG. 3C. The second spacer 14F may be formed between the first spacer 13 and the contact plug 15. The conductive line structure CL may include a line shape extending while passing through the center of the first spacer 13. Accordingly, a pair of gaps GF1 and GF2 formed with the contact plug 15 interposed therebetween may be formed symmetrically. For example, the pair of gaps GF1 and GF2 may be the same volume.

Figure 3G:
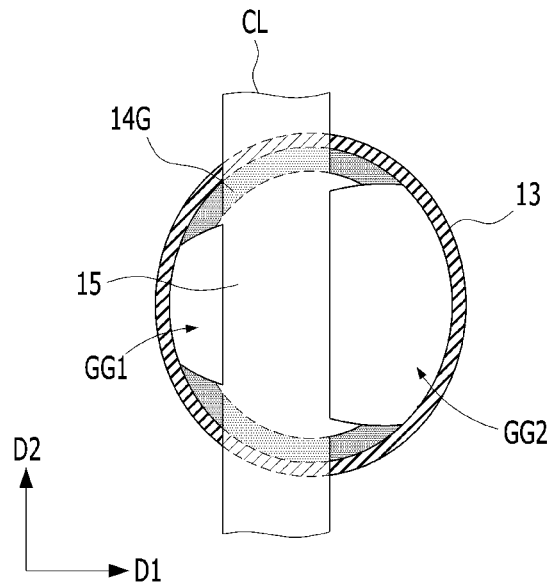

Referring to FIG. 3G, the second spacer 14G may partially overlap with the conductive line structure CL. The contact plug 15 may partially overlap with the conductive line structure CL. The second spacer 14G may remain without being removed in a cleaning process after the conductive line structure CL is formed. The second spacer 14G may have more sacrificial spacer remaining than the second spacer 14D of FIG. 3D. The second spacer 14G may be formed between the first spacer 13 and the contact plug 15. The conductive line structure CL may include a line shape that extends along the second direction D2 and is moved to the left from the center of the first spacer 13. Accordingly, a pair of gaps GG1 and GG2 formed with the contact plug 15 interposed therebetween may be formed asymmetrically. For example, the pair of gaps GG1 and GG2 may have different volumes.

Figure 3H:
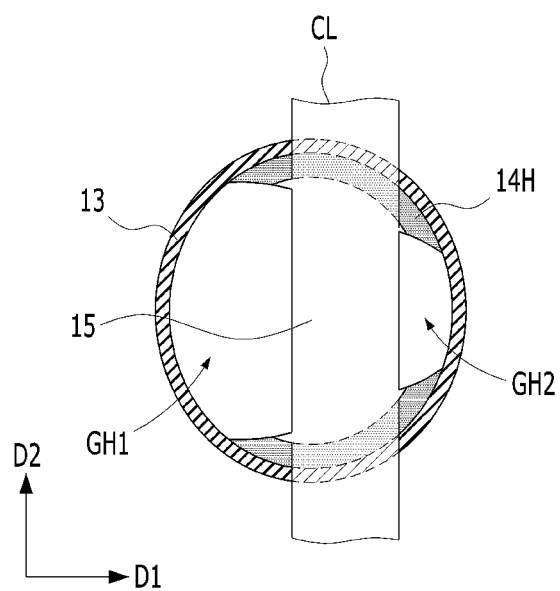

Referring to FIG. 3H, the second spacer 14H may partially overlap with the conductive line structure CL. The contact plug 15 may partially overlap with the conductive line structure CL. The second spacer 14H may remain without being removed in a cleaning process after the conductive line structure CL is formed. The second spacer 14H may have more sacrificial spacers than the second spacer 14H of FIG. 3E. The second spacer 14H may be formed between the first spacer 13 and the contact plug 15. The conductive line structure CL may include a line shape that extends along the second direction D2 and is moved to the right from the center of the first spacer 13. Accordingly, a pair of gaps GH1 and GH2 formed with the contact plug 15 interposed therebetween may be formed asymmetrically. For example, the pair of gaps GH1 and GH2 may be different volumes.

The present invention may not be limited to the embodiments of FIGS. 3A to 3H, and may be formed in various other forms. As the second spacer 14 remains only in an area overlapping with the conductive line structure CL, the short circuit defect of the contact plug 15 may be improved.

Figure 4:
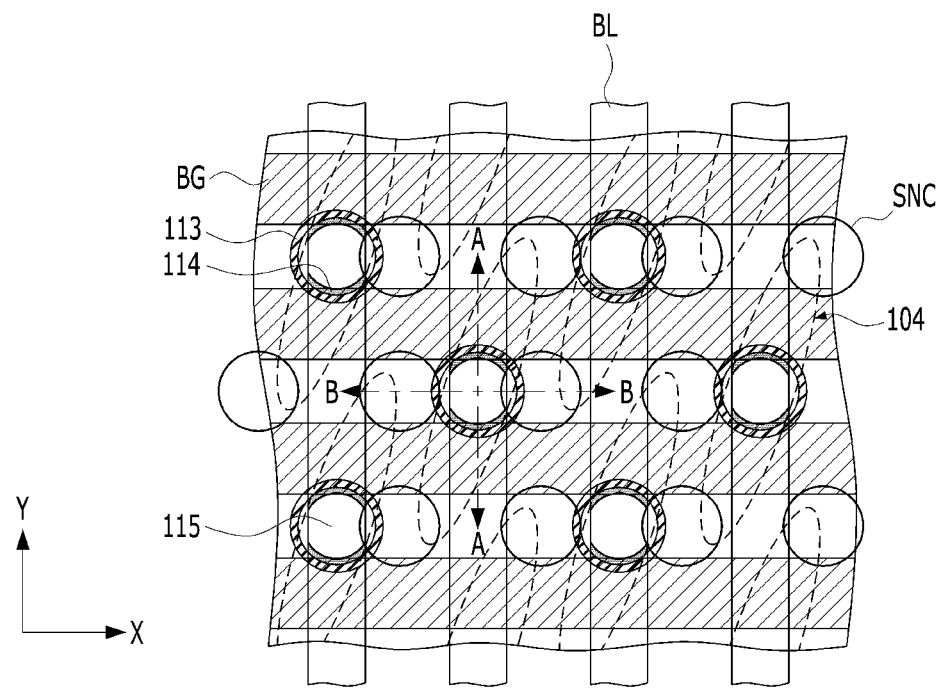
FIG. 4 is a top view illustrating a semiconductor device in accordance with an embodiment of the present disclosure.
Figure 5:
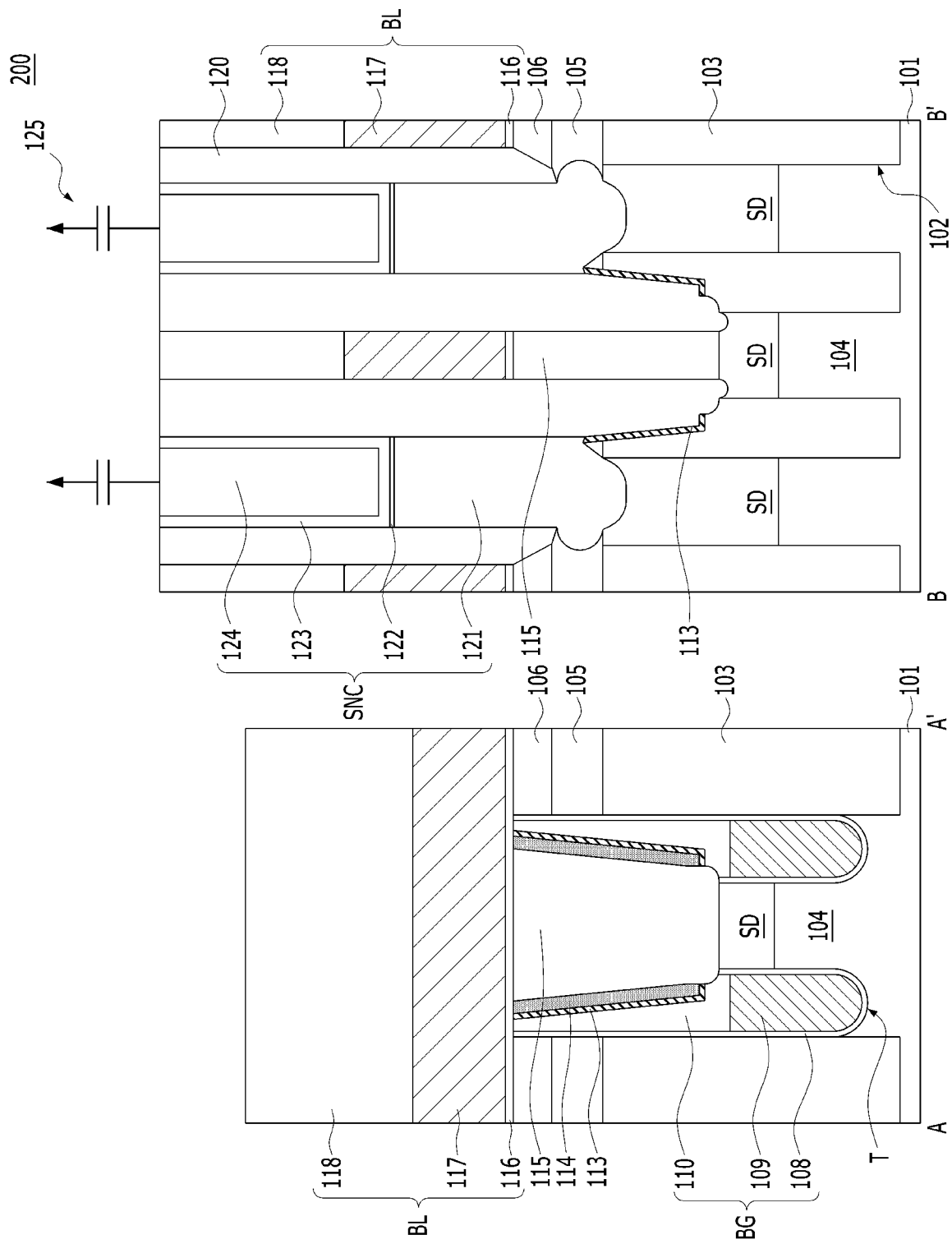
FIG. 5 shows cross-sectional views illustrating a semiconductor device in accordance with an embodiment of the present disclosure.

FIG. 4 is a top view illustrating a semiconductor device 200 in accordance with an embodiment of the present disclosure. FIG. 4 is a view from which some of the constituent elements are omitted to describe a first spacer 113 and a second spacer 114. FIG. 5 is a cross-sectional view of the semiconductor device 200 taken along a line A-A' and a line B-B' of FIG. 4 in accordance with the embodiment of the present disclosure.

Referring to FIG. 4, the semiconductor device 200 may include a plurality of memory cells. Each of memory cells may include an active region 104, an isolation layer (not shown), a buried gate structure BG, a bit line structure BL, a first spacer 113, a second spacer 114, and a storage node contact plug SNC, and a storage node (not shown). The buried gate structure BG may extend in a first direction X, and the bit line structure BL may extend in a second direction Y. The storage node contact plug SNC may be positioned spaced apart from the bit line structure BL in the first direction X. The first direction X and the second direction Y may be perpendicular to each other.

A bit line contact plug 115 may be formed below the bit line structure BL. The X-directional line width of the bit line contact plug 115 may be the same as the X-directional line width of the bit line structure BL. The storage node contact plug SNC may be adjacent to the bit line contact plug 115. A storage node (not shown) may be positioned over the storage node contact plug SNC.

The first spacer 113 may partially overlap with the bit line structure BL. The top view of the first spacer 113 may have a circular shape or an elliptical shape. The circumference of the first spacer 113 may be larger than that of the bit line contact plug 115. The first spacer 113 may have a shape surrounding the bit line contact plug 115. The first spacer 113 may partially contact the storage node contact plug SNC. The first spacer 113 may be positioned between the bit line structure BL and the storage node contact plug SNC.

The second spacer 114 may be positioned between the bit line contact plug 115 and the first spacer 113. The second spacer 114 may directly contact the bit line contact plug 115. The second spacer 114 may be positioned at an end of the bit line contact plug 115 in the second direction Y. The second spacer 114 may include a pair of spacers respectively positioned at both ends of the bit line contact plug 115 in the second direction Y. The bit line contact plug 115, the second spacer 114, and the first spacer 113 may be laterally arranged in the second direction Y. The second spacer 114 may overlap with the bit line structure BL. The second spacer 114 may not overlap with the bit line contact plug 115.

Referring to FIG. 5, an isolation layer 103 may be formed in a substrate 101. The isolation layer 103 may be formed in an isolation trench 102. An active region 104 may be defined by the isolation layer 103.

The substrate 101 may include a silicon-containing material. The substrate 101 may also include other semiconductor materials, such as germanium. The substrate 101 may include a Silicon-On-Insulator (SOI) substrate. The isolation layer 103 may be a Shallow Trench Isolation region (STI) formed by etching the isolation trench 102. The isolation layer 103 may be formed by filling the isolation trench 102 with a dielectric material. The isolation layer 103 may include, for example, silicon oxide, silicon nitride, or a combination thereof. Source/drain regions SD may be formed in the active region 104. The source/drain regions SD may be doped with an impurity of a conductive type. The conductive impurity may include phosphorus (P), arsenic (As), antimony (Sb), or boron (B).

A first inter-layer dielectric layer 105 may be formed over the substrate 101. A second inter-layer dielectric layer 106 may be formed on the first inter-layer dielectric layer 105. The first and second inter-layer dielectric layers 105 and 106 may include a dielectric material. The first and second inter-layer dielectric layers 105 and 106 may include, for example, silicon oxide, silicon nitride, low-k materials, or a combination thereof. For example, the first inter-layer dielectric layer 105 may include silicon oxide, and the second inter-layer dielectric layer 106 may include silicon nitride.

A buried gate structure BG may be formed in the substrate 101. The buried gate structure BG may include a gate dielectric layer 108, a gate electrode 109, and a gate capping layer 110. The buried gate structure BG may extend in a line shape.

A gate trench T may be formed in the substrate 101. The gate trench T may have a line shape traversing the active region 104 and the isolation layer 103. The sidewall of the gate trench T may contact the source/drain regions SD. The lower surface of the gate trench T may be positioned at a lower level than the lower surface of the source/drain region SD. The lower surface of the gate trench T may be positioned at a higher level than the lower surface of the isolation layer 103.

A gate dielectric layer 108 may be formed on the surface and sidewalls of the gate trench T. The gate dielectric layer 108 may cover the surface and sidewalls of the gate trench T. The gate insulating layer 108 may include, for example, silicon oxide, silicon nitride, silicon oxynitride, a high-k material, or a combination thereof.

A gate electrode 109 may be formed on the gate dielectric layer 108. The gate electrode 109 may partially fill the gate trench T. Accordingly, the gate electrode 109 may be referred to as a "buried gate electrode" or a "buried word line". The gate electrode 109 may include, for example, a metal, a metal nitride, or a combination thereof. For example, the gate electrode 109 may be formed of titanium nitride (TiN), tungsten (W), or titanium nitride/tungsten (TiN/W). Titanium nitride/tungsten (TiN/W) may have a structure formed by conformally forming titanium nitride and then partially filling the gate trench T. The gate electrode 109 may include, for example, titanium nitride. The gate electrode 109 may include, for example, tungsten-containing material mainly containing tungsten.

A gate capping layer 110 may be formed on the gate electrode 109. The gate capping layer 110 may fill the remaining portion of the gate trench T. The gate capping layer 110 may include a dielectric material. The gate capping layer 110 may include, for example, silicon nitride, silicon nitride, or a combination thereof. The gate capping layer 110 may have a NON (Nitride-Oxide-Nitride) structure.

A bit line contact plug 115 may be formed between the gate trenches T. The bit line contact plug 115 may partially overlap with the gate capping layer 110. The bit line contact plug 115 may penetrate the first and second inter-layer dielectric layers 105 and 106. The bit line contact plug 115 may be formed in the substrate 101. The bit line contact plug 115 may penetrate the first and second inter-layer dielectric layers 105 and 106 to extend into the substrate 101. The bit line contact plug 115 may be referred to as a 'buried plug'. The bit line contact plug 115 may include a lower portion extending into the substrate 101 and an upper portion penetrating the first and second inter-layer dielectric layers 105 and 106. The lower portion of the bit line contact plug 115 may have a deeper depth than the upper portion. The depth of a portion of the bit line contact plug 115 extending into the substrate 101 may be greater than the depth of a portion penetrating the inter-layer dielectric layer 105. The bit line contact plug 115 may include a silicon-containing material. The bit line contact plug 115 may include polysilicon, according to an embodiment. The bit line contact plug 115 may include doped-silicon, e.g., doped with an impurity. The bit line contact plug 115 may be formed by Selective Epitaxial Growth (SEG).

A first spacer 113 surrounding the bit line contact plug 115 may be formed. The first spacer 113 may partially overlap with the gate capping layer 110. The first spacer 113 may not contact the bit line contact plug 115. The top view of the first spacer 113 may have a circular shape or an elliptical shape. The bottom surface of the first spacer 113 may be positioned at a higher level than the bottom surface of the bit line contact plug 115. The bottom surface of the first spacer 113 may be positioned at the same level as the bottom surface of the bit line contact plug 115. The first spacer 113 may include a dielectric material. The first spacer 113 may include, for example, silicon oxide, silicon nitride, silicon oxynitride, or a combination thereof. The first spacer 13 may be formed by a Chemical Vapor Deposition (CVD) method or an Atomic Layer Deposition (ALD) method.

The second spacer 114 may be positioned on the first spacer 113. The second spacer 114 may not overlap with the bit line contact plug 115. The second spacer 114 may be positioned between the contact plug 115 and the first spacer 113. The second spacer 114 may directly contact the bit line contact plug 115. The second spacer 114 may directly contact the first spacer 113. The second spacer 114 may be formed as a pair of spacers facing each other. The second spacer 114 may include a material having a faster etching rate than that of the first spacer 113. The second spacer 114 may be formed of or include a silicon-containing material. The second spacer 114 may include undoped-silicon (Undoped-Si). The second spacer 114 may be formed of or include amorphous silicon (Amorphous Si), polysilicon (Poly Si), undoped-polysilicon (Undoped-Poly Si), or silicon germanium (SiGe). The second spacer 114 may also include, for example, a metal nitride. For example, the second spacer 14 may include, for example, titanium nitride (TiN). The second spacer 114 may be formed by a Chemical Vapor Deposition (CVD) method or an Atomic Layer Deposition (ALD) method.

A bit line structure BL may be formed on the bit line contact plug 115. The bit line structure BL may include a barrier metal layer 116, a bit line 117, and a bit line hard mask layer 118. The bit line structure BL may extend in a line shape. The bit line structure BL may extend in one direction while covering the bit line contact plug 115. The bit line contact plug 115, the barrier metal layer 116, the bit line 117, and the bit line hard mask layer 118 may have the same line width.

The barrier metal layer 116 may be formed on the bit line contact plug 115. The barrier metal layer 116 may include, for example, a metal or a metal nitride. The barrier metal layer 116 may include, for example, titanium nitride (TiN), tantalum nitride (TaN), tungsten nitride (WN), or a combination thereof.

The bit line 117 may be formed on the barrier metal layer 116. The bit line 117 may include a single layer, a double layer, or a stacked structure of a plurality of layers of three or more layers. The bit line 117 may extend in the second direction Y while covering the bit line contact plug 115 and the second spacer 114. The bit line 117 may extend in a line shape. The bit line 117 may include a material having a lower specific resistance than the bit line contact plug 115. The bit line 117 may include, for example, a metal material having a lower specific resistance than the bit line contact plug 115. The bit line 117 may include, for example, a metal, a metal nitride, a metal silicide, or a combination thereof. The bit line 117 may include, for example, tungsten-containing material. The bit line 117 may include, for example, tungsten (W) or a tungsten compound. The bit line 117 may be formed by stacking tungsten silicide, a tungsten nitride film, and a tungsten layer.

The bit line hard mask layer 118 may be formed on the bit line 117. The thickness of the bit line hard mask layer 118 may be greater than the thickness of the bit line 117. The bit line hard mask layer 118 may be formed of a dielectric material. The bit line hard mask layer 118 may be formed of a material having an etch selectivity with respect to the bit line 117. The bit line hard mask layer 118 may include, for example, silicon oxide, silicon nitride, silicon oxynitride, or a combination thereof.

Bit line spacers 120 may be formed on both sidewalls of the bit line contact plug 115 and on both sidewalls of the bit line structure BL. The bit line spacer 120 may be formed between the bit line contact plug 115 and the first spacer 113. The bit line spacer 120 may be independently formed on both sides of the bit line contact plug 115. The bit line spacer 120 may extend in a line shape. The upper surface of the bit line spacer 120 may be positioned at the same level as the upper surface of the bit line structure BL. The bit line spacer 120 may include a dielectric material. The bit line spacer 120 may include a low-k material. The bit line spacer 120 may include an oxide or a nitride. The bit line spacer 120 may include a multi-layer spacer. The bit line spacer 120 may include an air gap (not shown).

According to an embodiment, a gap-fill material may be formed between the bit line contact plug 115 and the first spacer 113. The upper surface of the gap-fill material may be positioned at the same level as the upper surface of the first spacer 113. The bit line spacer 120 may be formed over the gap-fill material. The gap-fill material may include a dielectric material.

A storage node contact plug SNC may be formed between the bit line structures BL. The storage node contact plug SNC may be coupled to the substrate 101. The storage node contact plug SNC may include a lower plug 121, an ohmic contact layer 122, a conductive liner 123, and an upper plug 124. The conductive liner 123 may be selectively omitted. The storage node contact plug SNC may contact the first spacer 113. Accordingly, the first spacer 113 may include a first dielectric material contacting the storage node contact plug SNC and a second dielectric material contacting the second spacer, and the first dielectric material and the second dielectric material may be continuous with each other.

The lower plug 121 may be formed on the substrate 101. The bit line spacer 120 may be positioned between the bit line 117 and the lower plug 121. The bottom surface of the lower plug 121 may be coupled to the source/drain region SD. The upper surface of the lower plug 121 may be positioned at a lower level than the upper surface of the bit line 111. The lower plug 121 may include a silicon-containing material. The lower plug 121 may be doped with an impurity. The lower plug 121 may include doped-silicon e.g., doped with an impurity.

The ohmic contact layer 122 may be formed on the lower plug 121. The ohmic contact layer 122 may include, for example, a metal silicide. The ohmic contact layer 122 may include cobalt silicide ($CoSi_x$). According to an embodiment, the ohmic contact layer 122 may include cobalt silicide of '$CoSi_2$ phase'.

The conductive liner 123 may be formed on an upper surface of the ohmic contact layer 122 and a partial side surface of the bit line spacer 120. The conductive liner 123 may be selectively omitted. The conductive liner 123 may include, for example, a metal or a metal nitride. The conductive liner 123 may include, for example, titanium (Ti), titanium nitride (TiN), titanium silicon nitride (TiSiN), tantalum (Ta), tantalum nitride (TaN), tungsten nitride (WN), or a combination thereof.

The upper plug 124 may be formed on the conductive liner 123. The upper plug 124 may include a conductive material. The upper plug 124 may include, for example, a metal-containing material. The upper plug 124 may include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). According to an embodiment, the upper plug 124 may include, for example, tungsten (W)-containing material. The upper plug 124 may include, for example, tungsten (W).

The storage node 125 may be formed on the upper plug 124. The storage node 125 may be a capacitor. The storage node 125 may have a shape of a cylinder, a pillar, or a combination of a cylinder and a pillar. The storage node 125 may include a lower electrode, a dielectric layer, and an upper electrode. The lower electrode and the upper electrode may include, for example, a metal layer, a metal nitride, or a combination thereof. For example, the lower electrode and the upper electrode may include cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), or a combination thereof. The dielectric layer may include at least one selected from among zirconium oxide, aluminum oxide, and hafnium oxide. The dielectric layer may include a ZAZ structure in which a first zirconium oxide, an aluminum oxide, and a second zirconium oxide are stacked.

According to the above-described embodiment, by forming the first spacer 113, the dopant of the bit line contact plug 115 may not flow into the substrate 101. Accordingly, property defects of the semiconductor device that may be caused by the dopant flowing into the substrate 101 may be eliminated. Also, it is possible to protect the first spacer 113 by forming the second spacer 114. When the bit line structure BL is formed, the second spacer 114 may increase the etching rate. Since the second spacer 114 includes amorphous silicon (Amorphous Si), polysilicon (Poly Si), undoped-polysilicon (Undoped-Poly Si), silicon germanium (SiGe), titanium nitride (TiN), or a combination thereof, a portion where the second spacer 114 does not overlap with the bit line structure BL may be decreased. Accordingly, short circuit defects of the bit line contact plug 115 may be improved.

FIGS. 6A to 6L and FIGS. 7A to 7E illustrate a method for fabricating the semiconductor device 200 in accordance with an embodiment of the present disclosure. FIGS. 6A to 6L are cross-sectional views taken along a line A-A' and a line B-B' of FIG. 4. FIGS. 7A to 7E illustrate steps following the step of FIG. 6L, and FIGS. 7A to 7E are cross-sectional views taken along a line B-B' of FIG. 4. The top view of the semiconductor device 200 may be as shown in FIG. 4. The semiconductor device 200 may be similar to the semiconductor device 200 of FIGS. 4 to 5. The constituent elements also appearing in the semiconductor device 200 of FIGS. 4 to 5 may use the same reference numerals. Hereinafter, detailed description on the constituent elements also appearing in FIGS. 4 to 5 may be omitted.

Figure 6A:
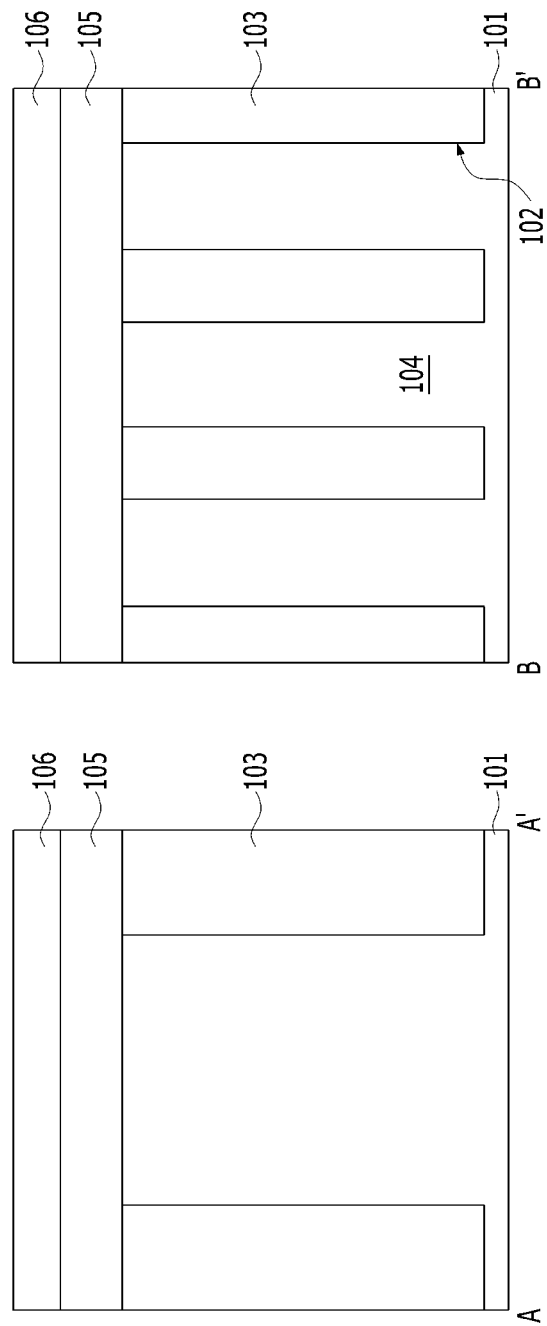
FIGS. 6A to 6L show cross-sectional views illustrating a method for fabricating a semiconductor device in accordance with an embodiment of the present disclosure.

Referring to FIG. 6A, a substrate 101 may be prepared. A first inter-layer dielectric layer 105 may be formed over the substrate 101. A second inter-layer dielectric layer 106 may be formed over the first inter-layer dielectric layer 105. The first and second inter-layer dielectric layers 105 and 106 may include a dielectric material. The first and second inter-layer dielectric layers 105 and 106 may include, for example, silicon oxide, silicon nitride, a low-k material, or a combination thereof. For example, the first inter-layer dielectric layer 105 may include, for example, silicon oxide, and the second inter-layer dielectric layer 106 may include, for example, silicon nitride.

Figure 6B:
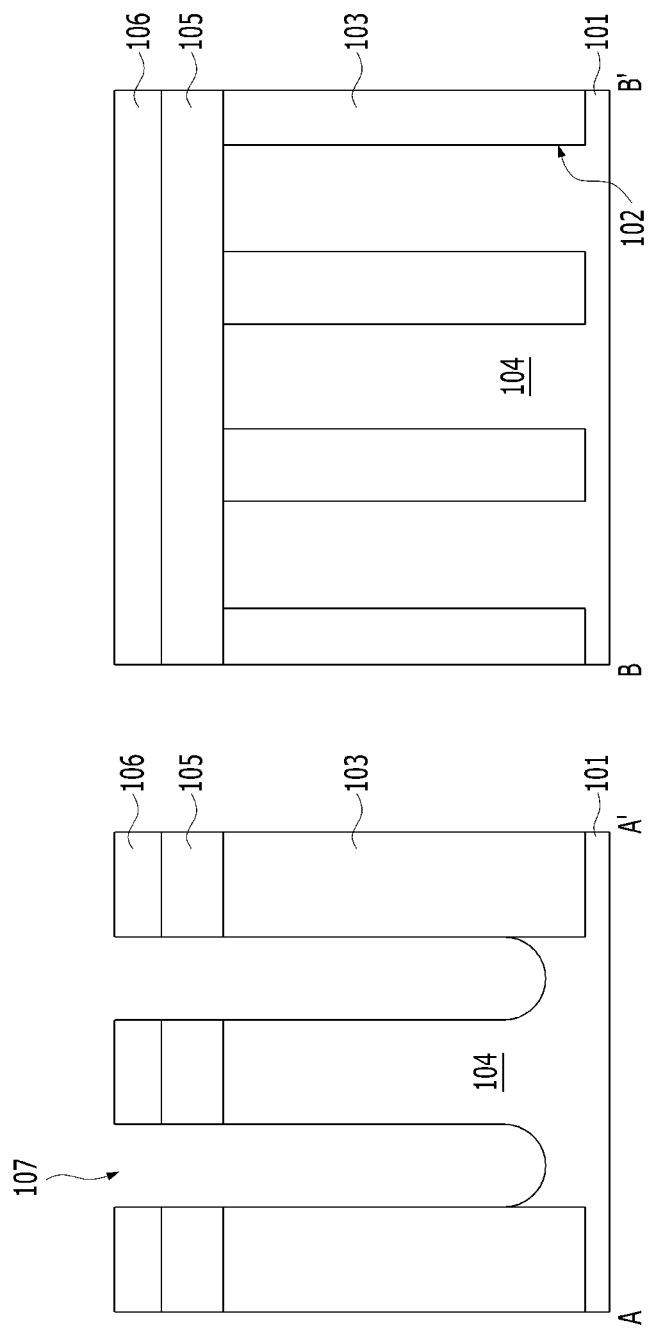

Referring to FIG. 6B, a gate trench T may be formed in the substrate 101. The gate trench T may have a line shape traversing the active region 104 and the isolation layer 103. The gate trench T may be formed by forming a mask pattern (not shown) over the substrate 101 and performing an etching process using the mask pattern as an etching mask. In order to form the gate trench T, the first and second inter-layer dielectric layers 105 and 106 may be used as etch barriers. The first and second inter-layer dielectric layers 105 and 106 may be patterned by a mask pattern.

The bottom surface of the gate trench T may have a higher level than the bottom surface of the isolation layer 103. The depth of the gate trench T may have a depth sufficient to increase the average cross-sectional area of the subsequent gate electrode. Accordingly, the resistance of the gate electrode may be reduced. Although not shown, a portion of the isolation layer 103 may be recessed to protrude the upper portion of the active region 104 below the gate trench T. For example, the isolation layer 103 below the gate trench T may be selectively recessed. Accordingly, a fin region (not shown) may be formed below the gate trench T. The fin region may be a portion of a channel region.

Figure 6C:
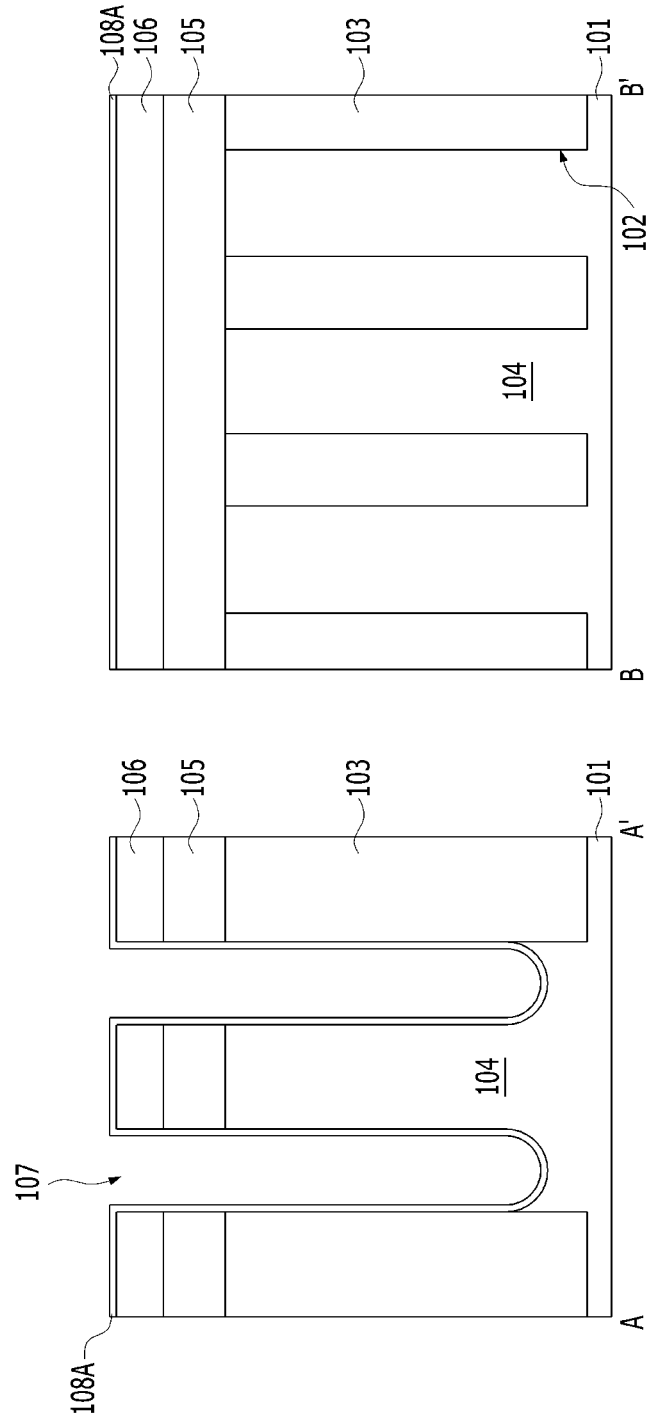

Referring to FIG. 6C, a preliminary gate dielectric layer 108A may be formed on the surface and sidewalls of the gate trench T. Before the preliminary gate dielectric layer 108A is formed, etching damage on the surface of the gate trench T may be cured. For example, after a sacrificial oxide is formed by a thermal oxidation treatment, the sacrificial oxide may be removed. The preliminary gate dielectric layer 108A may be formed by a thermal oxidation process. For example, the preliminary gate dielectric layer 108A may be formed by oxidizing the bottom and sidewalls of the gate trench T. According to an embodiment, the preliminary gate dielectric layer 108A may be formed by a deposition method, such as Chemical Vapor Deposition (CVD) or Atomic Layer Deposition (ALD).

The preliminary gate dielectric layer 108A may include a high-k material, an oxide, a nitride, an oxynitride, or a combination thereof. The preliminary gate dielectric layer 108A may be formed by depositing a liner polysilicon layer and then radically oxidizing the liner polysilicon layer. The preliminary gate dielectric layer 108A may be formed by forming a liner silicon nitride layer and then radically oxidizing the liner silicon nitride layer.

Figure 6D:
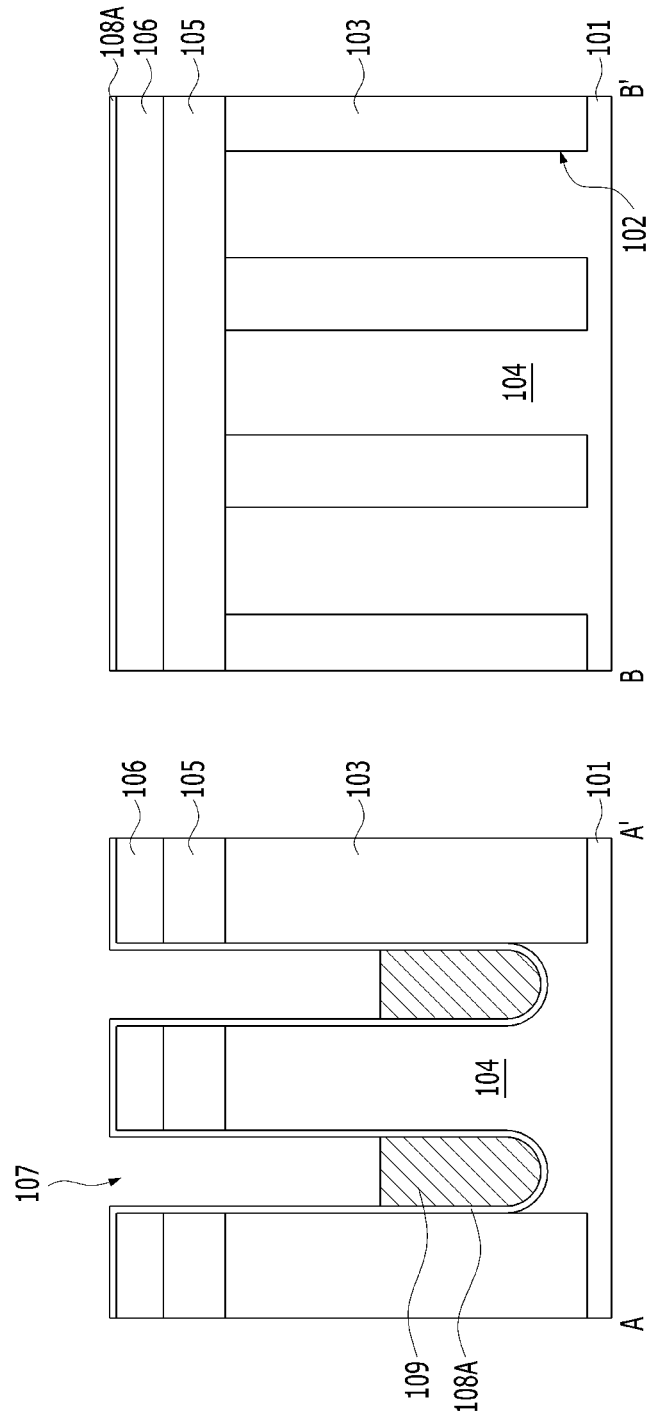

Referring to FIG. 6D, a gate electrode 109 may be formed over the preliminary gate dielectric layer 108A. To form the gate electrode 109, a conductive layer (not shown) filling the gate trench T may be formed and then a recessing process may be performed. The recessing process may be performed as an etch-back process, or a Chemical Mechanical Polishing (CMP) process and an etch-back process may be sequentially performed. The gate electrode 109 may partially fill the gate trench T. The gate electrode 109 may have a recessed shape. The upper surface of the gate electrode 109 may be positioned at a lower level than the upper surface of the active region 104.

The gate electrode 109 may include, for example, a metal, a metal nitride, or a combination thereof. The gate electrode 109 may be formed of titanium nitride (TiN), tungsten (W), or titanium nitride/tungsten (TiN/W). Titanium nitride/tungsten (TiN/W) may have a structure in which titanium nitride is conformally formed and then the gate trench T is partially filled with tungsten. As for the gate electrode 109, titanium nitride may be used alone, and this may be referred to as a gate electrode 109 having a 'TiN-Only' structure.

Figure 6E:
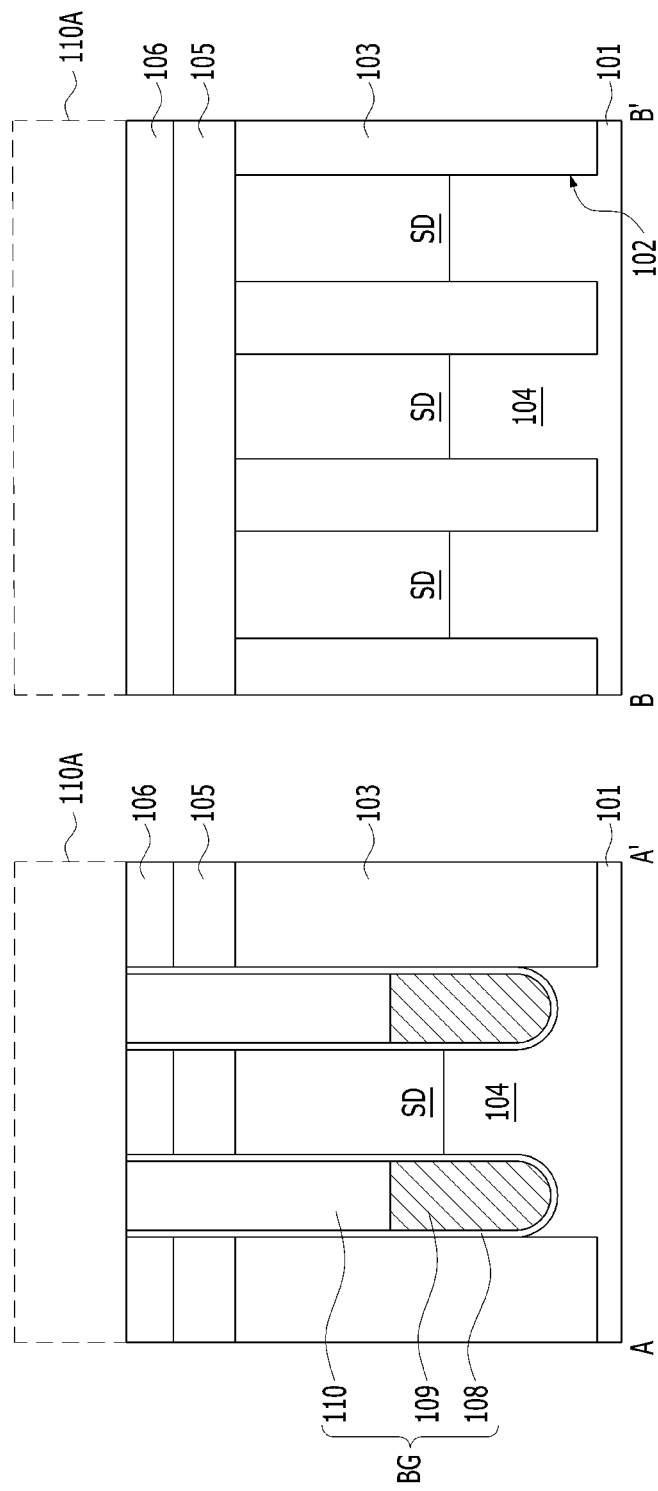

Referring to FIG. 6E, a gate capping layer 110 may be formed over the gate electrode 109. The gate capping layer 110 may fill the remaining portion of the gate trench T. The upper surface of the gate capping layer 110 may be positioned at the same level as the upper surface of the second inter-layer dielectric layer 106. To this end, after the preliminary gate capping layer 110A is formed, a planarization process may be performed. The gate capping layer 110 may include a dielectric material. The gate capping layer 110 may include, for example, silicon nitride, silicon oxide, or a combination thereof. The gate capping layer 110 may include a NON (Nitride-Oxide-Nitride) structure.

As the preliminary gate capping layer 110A is planarized, a portion of the preliminary gate dielectric layer 108A may be removed. Accordingly, the upper surface of the second inter-layer dielectric layer 106 may be exposed. As a portion of the preliminary gate dielectric layer 108A is removed, the gate dielectric layer 108 may be formed. A buried gate structure BG may be formed in the substrate 101. The buried gate structure BG may include a gate dielectric layer 108, a gate electrode 109, and a gate capping layer 110. The buried gate structure BG may extend in a line shape.

Subsequently, source/drain regions SD may be formed in the active region 104. A doping process may be performed to form the source/drain regions SD. The source/drain regions SD may be doped with an impurity of the same conductive type. The source/drain regions SD may be areas to which a bit line contact plug or a storage node contact plug is to be coupled.

Figure 6F:
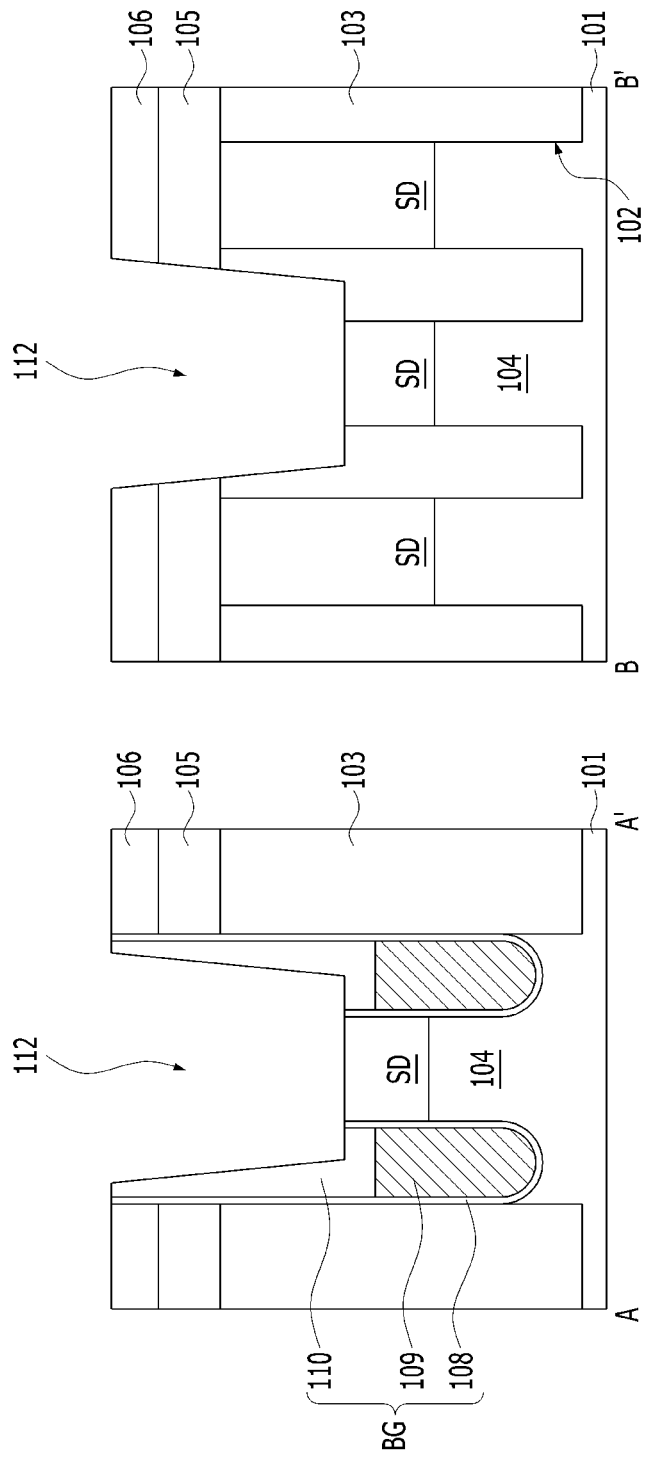

Referring to FIG. 6F, a bit line contact hole 112 may be formed in the first and second inter-layer dielectric layers 105 and 106. The bit line contact hole 112 may be formed by using a bit line opening mask (not shown) as an etching mask and etching the first and second inter-layer dielectric layers 105 and 106. The bit line opening mask (not shown) may include a photoresist pattern.

From a perspective of a top view, the bit line contact hole 112 may be elliptical, for example, a circle or an oval. A portion of the substrate 101 may be exposed by the bit line contact hole 112. A portion of the gate capping layer 110 may be exposed by the bit line contact hole 112. The diameter of the bit line contact hole 112 may be wider than the diameter of the source/drain regions SD. Accordingly, a portion of the isolation layer 103 around the source/drain regions SD may be exposed by the bit line contact hole 112. The bit line contact hole 112 may be buried in the substrate 101.

Figure 6G:
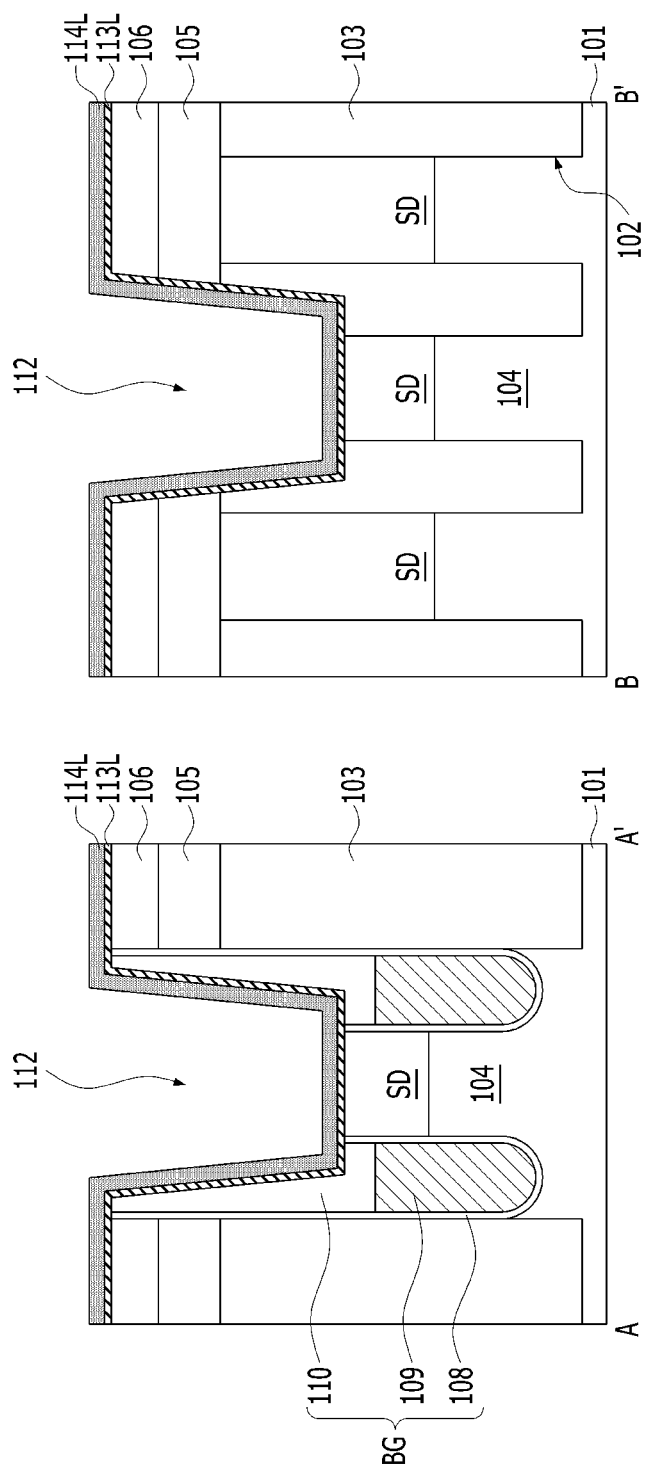

Referring to FIG. 6G, a preliminary first spacer 113L may be formed in the bit line contact hole 112. The preliminary first spacer 113L may cover the substrate 101. The preliminary first spacer 113L may cover the bottom surface and sidewalls of the bit line contact hole 112. The preliminary first spacer 113L may cover the upper surface of the second inter-layer dielectric layer 106.

The preliminary first spacer 113L may include a dielectric material. The preliminary first spacer 113L may include, for example, an oxide a nitride, or a combination thereof. The preliminary first spacer 113L may include, for example, silicon oxide, silicon nitride, silicon oxynitride, or a combination thereof. According to an embodiment, the preliminary first spacer 113L may be formed of silicon oxide. The preliminary first spacer 113L may be formed by a Chemical Vapor Deposition (CVD) or Atomic Layer Deposition (ALD) method.

A preliminary sacrificial spacer 114L may be formed on the preliminary first spacer 113L. The preliminary sacrificial spacer 114L may cover the preliminary first spacer 113L. The preliminary sacrificial spacer 114L may be formed in the bit line contact hole 112. The thickness of the preliminary sacrificial spacer 114L may be thicker than the thickness of the preliminary first spacer 113L.

The preliminary sacrificial spacer 114L may include a material having a faster etching rate than the preliminary first spacer 113L. The preliminary sacrificial spacer 114L may be of a silicon-containing material. The preliminary sacrificial spacer 114L may be formed of or include amorphous silicon (Amorphous Si), polysilicon (Poly Si), undoped-silicon (Undoped-Si), undoped-polysilicon (Undoped-Poly Si) or silicon germanium (SiGe). When the preliminary sacrificial spacer 114L includes silicon germanium (SiGe), it may be referred to as a 'silicon germanium (SiGe) layer'. The preliminary sacrificial spacer 114L may include, for example, a metal nitride. For example, the preliminary sacrificial spacer 114L may include, for example, titanium nitride (TiN).

Figure 6H:
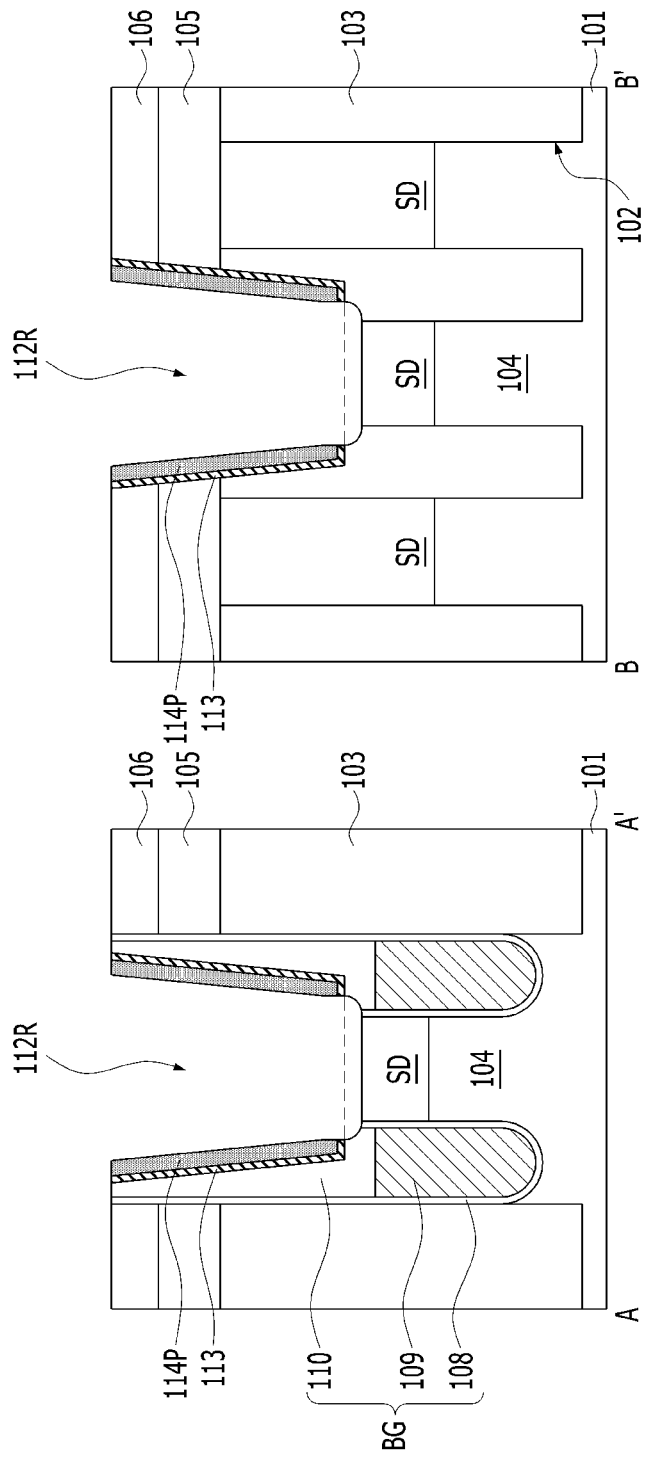

Referring to FIG. 6H, the preliminary sacrificial spacer 114L may be etched to form the sacrificial spacer 114P. The first spacer 113 may be formed by etching the preliminary first spacer 113L.

As the first spacer 113 and the sacrificial spacer 114P are formed, a portion of the substrate 101 may be exposed. As the first spacer 113 and the sacrificial spacer 114P are formed, the upper surface of the second inter-layer dielectric layer 106 may be exposed. The first spacer 113 may include a ring-shape surrounding a sidewall of the bit line contact hole 112. The first spacer 113 may include a surrounding-shape that surrounds a sidewall of the bit line contact hole 112. The sacrificial spacer 114P may cover the sidewall of the bit line contact hole 112 over the first spacer 113. Referring to FIG. 4, top views of the first spacer 13 and the sacrificial spacer 14P may have a ring-shape. As the first spacer 113 and the sacrificial spacer 114P are formed, the bottom surface of the bit line contact hole 112 may be exposed. The first spacer 113 and the sacrificial spacer 114P may partially overlap with the gate capping layer 110.

In an etching process for forming the first spacer 113 and the sacrificial spacer 114P, the source/drain regions SD, the isolation layer 103, and a portion of the gate capping layer 110 may be etched. The surface of the substrate 101 exposed in the inside of the bit line contact hole 112 may be further expanded by using the first spacer 113 and the sacrificial spacer 114P. That is, the gate capping layer 110, the source/drain regions SD, and the isolation layer 103 below the bit line contact hole 112 may be recessed to a predetermined depth. By extending the bottom surface of the bit line contact hole 112 into the substrate 101, the recessed bit line contact hole 112R may be formed. As the recessed bit line contact hole 112R is formed, the surface of some source/drain regions SD may be recessed, and the surface of some source/drain regions SD may be positioned at a lower level than the upper surface of the active region 104. As the recessed bit line contact hole 112R is formed, the bottom surface of the recessed bit line contact hole 112R may be positioned at a lower level than the bottom surfaces of the first spacer 113 and the sacrificial spacer 114P.

Figure 6I:
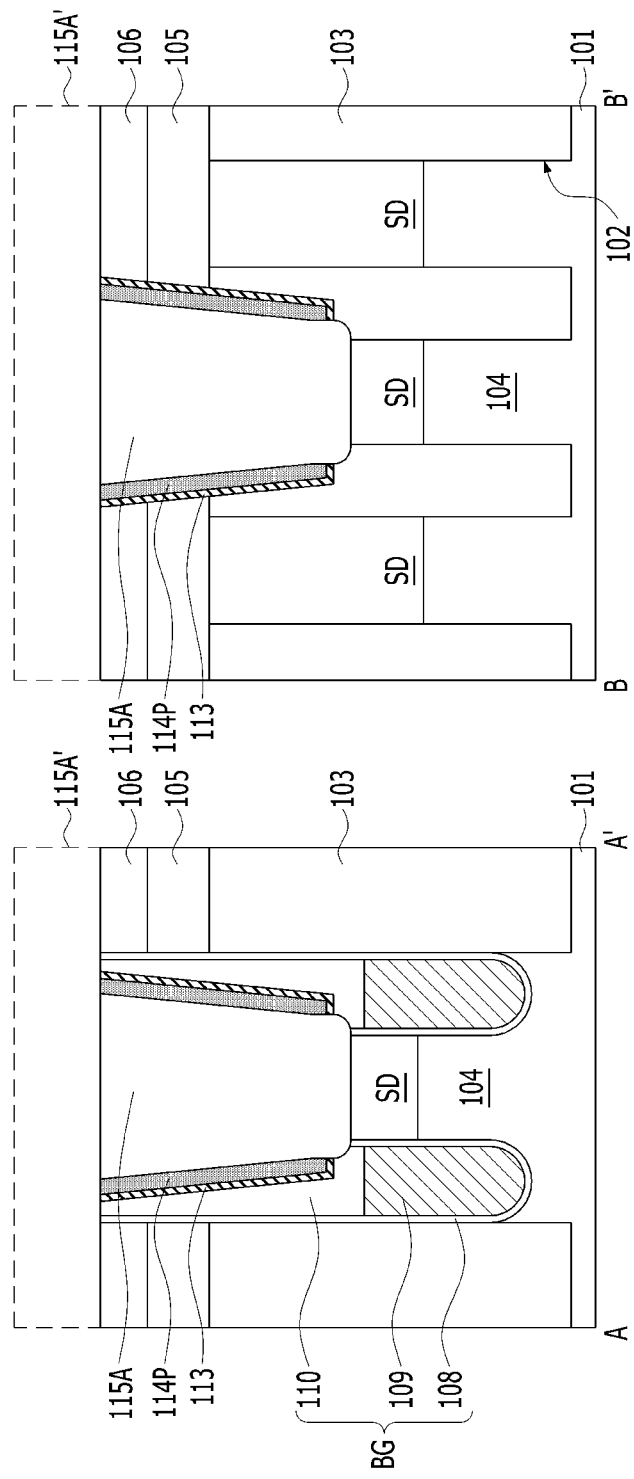

Referring to FIG. 6I, a first conductive material 115A may be formed in the recessed bit line contact hole 112R. The first conductive material 115A may fill the recessed bit line contact hole 112R. The first conductive material 115A may be formed by forming the preliminary first conductive material layer 115A' covering the second inter-layer dielectric layer 106 and performing a process of planarizing the preliminary first conductive material layer 115A' to expose the upper surface of the second inter-layer dielectric layer 106. The upper surface of the first conductive material 115A may be positioned at the same level as the upper surface of the second inter-layer dielectric layer 106. According to an embodiment, the first conductive material 115A may be formed by Selective Epitaxial Growth (SEG).

The first conductive material 115A may include a semiconductor material. The first conductive material 115A may include a silicon-containing material. The first conductive material 115A may include polysilicon, according to an embodiment. The first conductive material 115A may include doped-silicon, e.g., doped with an impurity. The first conductive material 115A may include doped-poly silicon, e.g., doped with an impurity. The first conductive material 115A may include a material having a slower etching rate than the preliminary sacrificial spacer 114L.

Figure 6J:
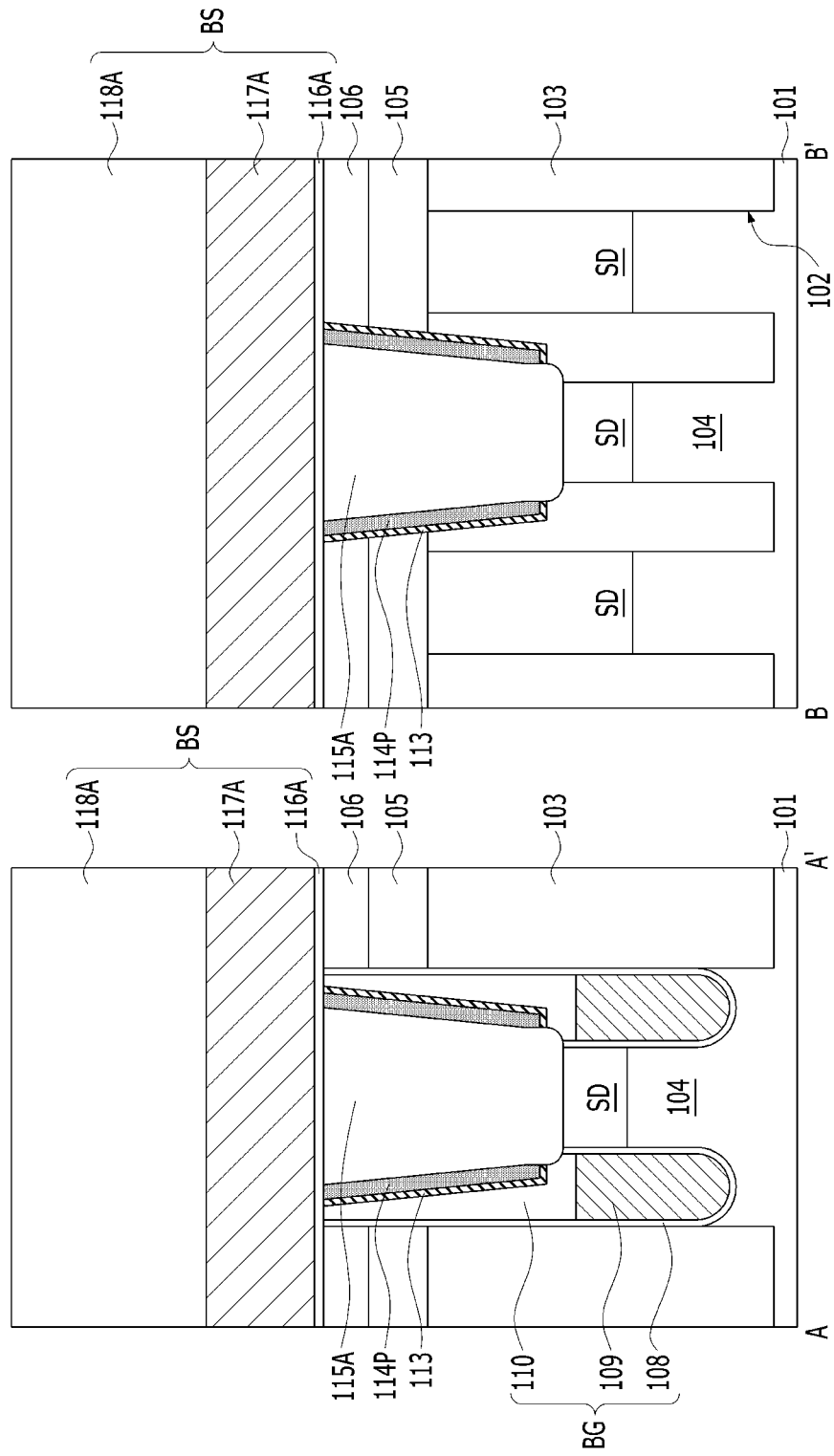

Referring to FIG. 6J, a bit line stack BS may be formed over the second inter-layer dielectric layer 106, the first conductive material 115A, the first spacer 113, and the sacrificial spacer 114P. The bit line stack BS may include a preliminary barrier metal layer 116A, a second conductive material 117A, and a preliminary bit line hard mask layer 118A.

A preliminary barrier metal layer 116A may be formed over the second inter-layer dielectric layer 106, the first conductive material 115A, the first spacer 113, and the sacrificial spacer 114P. The height of the preliminary barrier metal layer 116A may be smaller than the height of the second inter-layer dielectric layer 106. The preliminary barrier metal layer 116A may include, for example, titanium nitride (TiN), tantalum nitride (TaN), tungsten nitride (WN), or a combination thereof.

A second conductive material 117A may be formed over the preliminary barrier metal layer 116A. The second conductive material 117A may include a material having a lower specific resistance than the first conductive material 115A. The second conductive material 117A may include, for example, a metal material having a lower specific resistance than the first conductive material 115A. The second conductive material 117A may include, for example, a metal, a metal nitride, a metal silicide, or a combination thereof. According to an embodiment, the second conductive material 117A may include, for example, tungsten (W) or a tungsten compound.

A preliminary bit line hard mask layer 118A may be formed over the second conductive material 117A. The preliminary bit line hard mask layer 118A may be formed of a dielectric material. The preliminary bit line hard mask layer 118A may be formed of a material having an etching selectivity with respect to the second conductive material 117A. The preliminary bit line hard mask layer 118A may include, for example, silicon oxide, silicon nitride, silicon oxynitride, or a combination thereof.

Figure 6K:
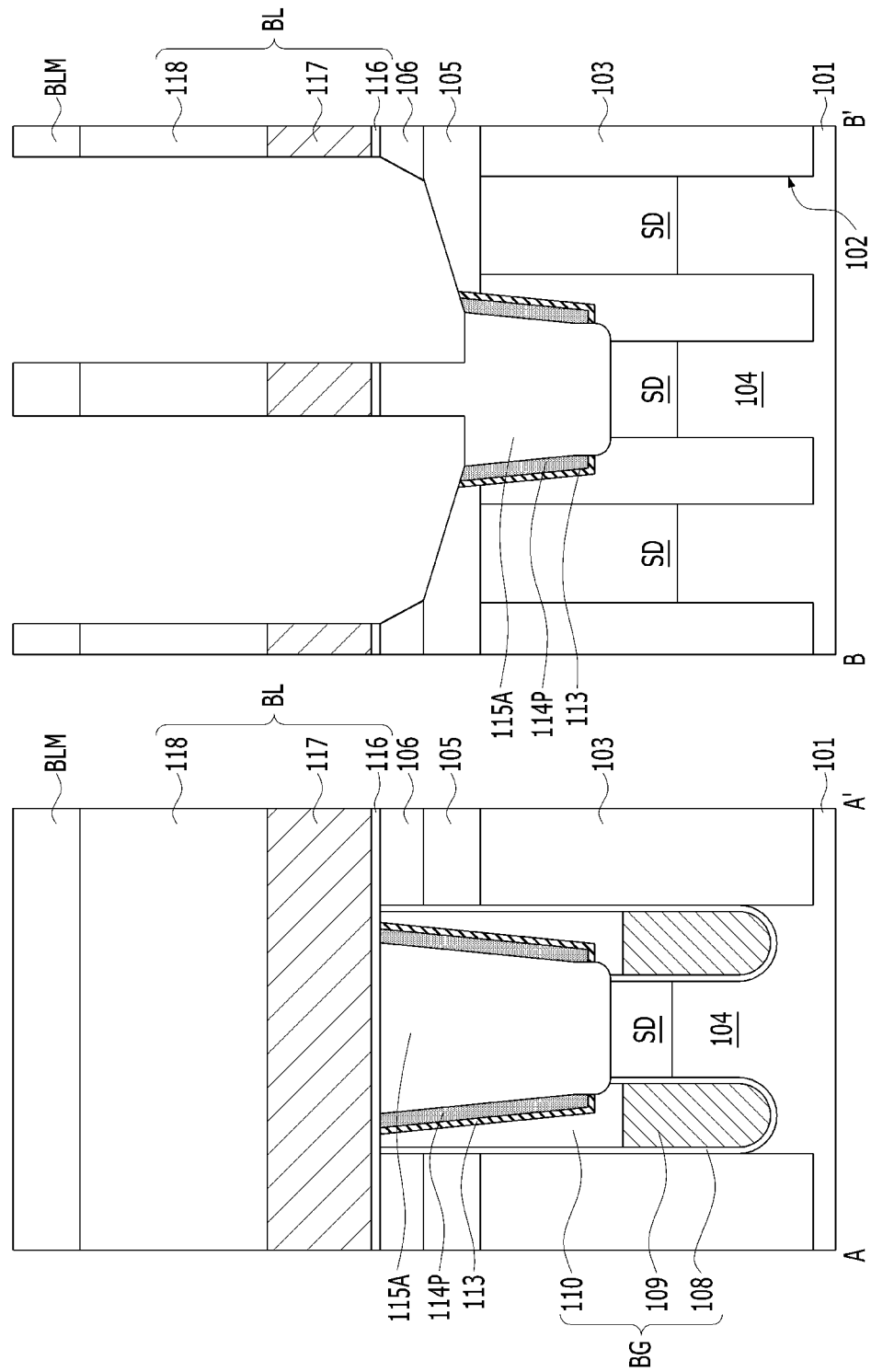

Referring to FIG. 6K, a bit line mask BLM may be formed over the preliminary bit line hard mask layer 118A. The bit line mask BLM may include a photoresist pattern. The bit line mask BLM may have a line shape extending in one direction. The line width of the bit line mask BLM may be smaller than the diameter of the bit line contact hole 112.

The preliminary bit line hard mask layer 118A may be etched by using the bit line mask BLM as an etching mask. As a result, the bit line hard mask layer 118 may be formed. The second conductive material 117A and the preliminary barrier metal layer 116A may be etched by using the bit line hard mask layer 118 as an etching mask. In this case, the second inter-layer dielectric layer 106, the first inter-layer dielectric layer 105, the first spacer 113, the sacrificial spacer 114P, and a portion of the first conductive material 115A may be etched. As a result, the bit line 117 and the barrier metal layer 116 may be formed. The bit line hard mask layer 118, the bit line 117, and the barrier metal layer 116 may have the same line width. The bit line hard mask layer 118, the bit line 117, and the barrier metal layer 116 may form a bit line structure BL. The bit line 117 may extend in one direction while covering the barrier metal layer 116. The bit line 117 may extend in a line shape.

Figure 6L:
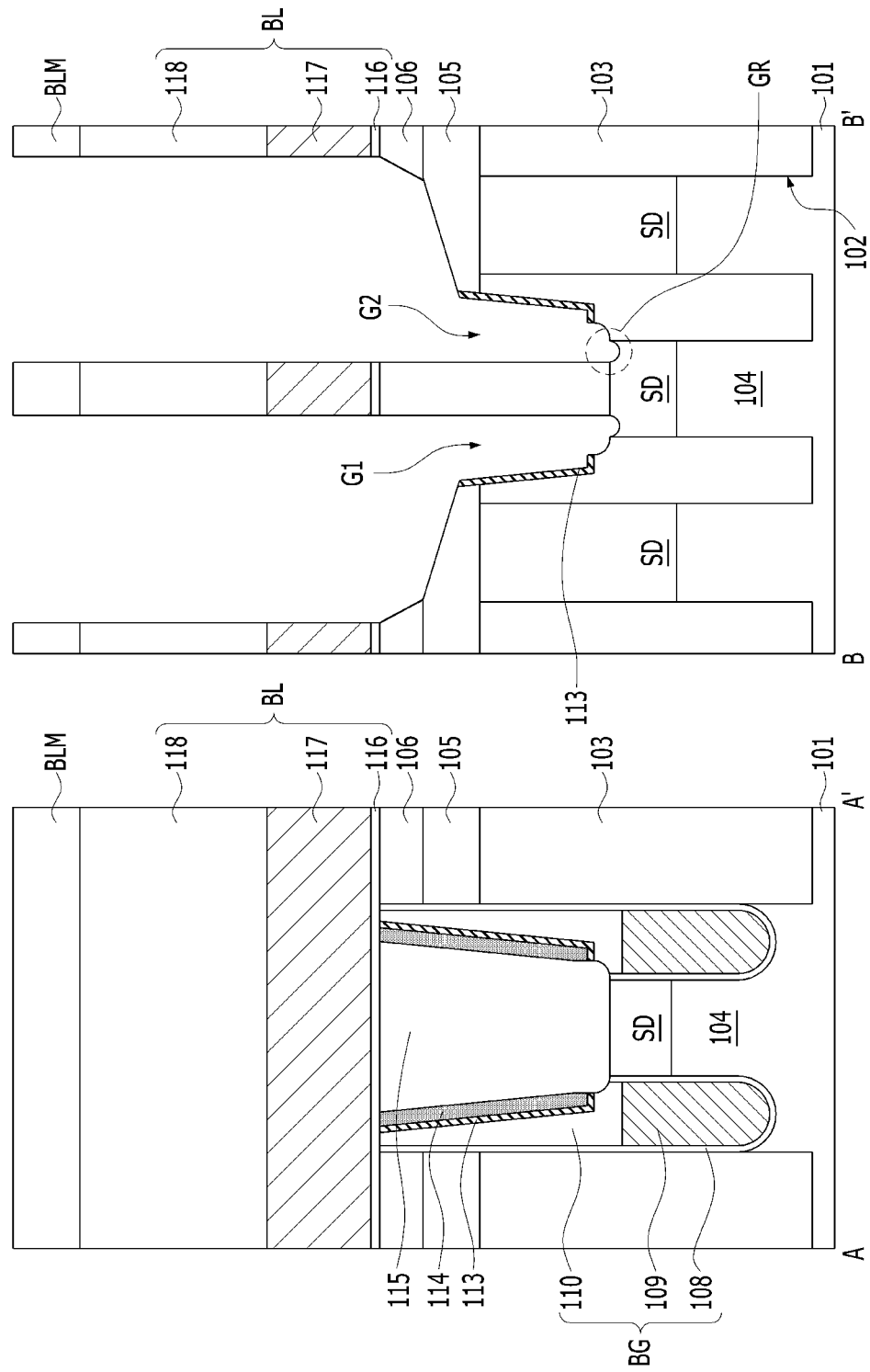

Referring to FIG. 6L, the first conductive material 115A and the sacrificial spacer 114P may be additionally etched. The first conductive material 115A and the sacrificial spacer 114P may be partially etched to be aligned with the bit line 117. Additional etching may be performed together with the etching process of FIG. 6K. The additional etching may be performed in-situ with the etching process of FIG. 6K. Accordingly, the bit line contact plug 115, the second spacer 114, and the gaps G1 and G2 may be formed. The line width of the bit line contact plug 115 may be the same as the line width of the bit line structure BL. The bit line 117 may extend in one direction while covering the bit line contact plug 115.

When the first conductive material 115A and the sacrificial spacer 114P are additionally etched, the first spacer 113 may remain. The sacrificial spacer 114P may protect the first spacer 113 so that the first spacer 113 is not etched. Accordingly, the first spacer 113 may have a shape surrounding the bit line contact plug 115. As illustrated in FIG. 4, the top view of the first spacer 113 may include a circle or an ellipse.

When the bit line contact plug 115 is formed by the first spacer 113, additional etching of the substrate 101 may be prevented. That is, the first spacer 113 may be used as an etch stop layer. Also, the first spacer 113 may prevent the dopant implanted into the bit line contact plug 115 from flowing into the substrate 101. Accordingly, property defects of the semiconductor device that may be caused by the dopant flowing into the neighboring active region may be improved.

Gaps G1 and G2 may be formed in a space from which a portion of the first conductive material 115A is removed to form the bit line contact plug 115. A pair of gaps G1 and G2 may be formed on both sidewalls of the bit line contact plug 115. The gaps G1 and G2 may be formed between the bit line contact plug 115 and the first spacer 113. The gaps G1 and G2 may be formed as a pair of gaps facing each other in the first direction X of FIG. 4 with the bit line contact plug 115 therebetween. The pair of gaps G1 and G2 may be independently formed on both sidewalls of the bit line contact plug 115. The pair of gaps G1 and G2 may be isolated by the bit line contact plug 115. The pair of gaps G1 and G2 may be symmetrical or asymmetrical with the bit line contact plug 115 interposed therebetween. For example, they may include one shape among the shapes of FIGS. 3A to 3H. The bit line contact plug 115, the gaps G1 and G2, and the first spacer 113 may be laterally arranged in the first direction X. The first spacer 113 may be partially exposed by the gaps G1 and G2. When the bit line contact plug 115 is formed by the first spacer 113, additional etching of the substrate 101 may be prevented, so that the pair of gaps G1 and G2 may be filled without voids in the subsequent process.

After the pair of gaps G1 and G2 is formed, the substrate 101 may be additionally recessed. Accordingly, the pair of gaps G1 and G2 may include an additional recess portion GR. The bottom surfaces of the pair of gaps G1 and G2 may be positioned at a lower level than the bottom surface of the bit line contact plug 115 by the additional recess portion GR.

The second spacer 114 may include a remaining portion of the sacrificial spacer 114P which is positioned spaced apart from the gaps G1 and G2. The second spacer 114 may be formed by cutting or trimming the sacrificial spacer 114P. The second spacer 114 may cover the un-exposed sidewall of the bit line contact plug 115. The second spacer 114 may not overlap with the pair of gaps G1 and G2. The second spacer 114 may partially cover the first spacer 113. The second spacer 114 may be formed between the bit line contact plug 115 and the first spacer 113. The bit line contact plug 115, the second spacer 114, and the first spacer 113 may be laterally arranged in the second direction Y of FIG. 4. The second spacers 114 may be formed as a pair of spacers facing each other in the second direction Y with the bit line contact plug 115 interposed therebetween. The second spacer 114 may be symmetrical or asymmetrical with the bit line contact plug 115 interposed therebetween. The second spacer 114 may have one shape of FIGS. 3A to 3H. The second spacer 114 may directly contact the first spacer 113. The second spacer 114 may directly contact the bit line contact plug 115. When the bit line contact plug 115 is formed, the second spacer 114 may protect the first spacer 113. Therefore, the first spacer 113 may remain without being etched. The sacrificial spacer 114P may have a faster etching rate than the first conductive material 115A. Also, as the second spacer 114 is formed, the area of the pair of gaps G1 and G2 may be formed to be large. As a result, a short circuit defect of the bit line contact plug 115 may be reduced.

Subsequently, the gaps G1 and G2 may be cleaned to expand the gaps G1 and G2. The cleaning process may use a wet chemical. As the cleaning process is performed, the remaining amount of the sacrificial spacer 114P may be reduced. Accordingly, the linear length of the second spacer 114 in the first direction X may be the same as the linear length of the bit line contact plug 115 in the first direction X. That is, more sacrificial spacers 114P may be removed by the cleaning process. The second spacer 114 may overlap only with the bit line structure BL. Accordingly, since the pair of gaps G1 and G2 may be formed to be large, a short circuit defect of the bit line contact plug 115 may be prevented. For example, when the second spacer 114 includes silicon germanium (SiGe), the linear length of the second spacer 114 formed by the cleaning process in the first direction X may be smaller than that of a case including a different material.

Subsequently, the bit line mask BLM may be removed.

FIGS. 7A to 7E are cross-sectional views of a subsequent process. However, since the cross-sectional view for the line A-A' of FIG. 4 is similar to that of FIG. 6L, it may be omitted.

Figure 7A:
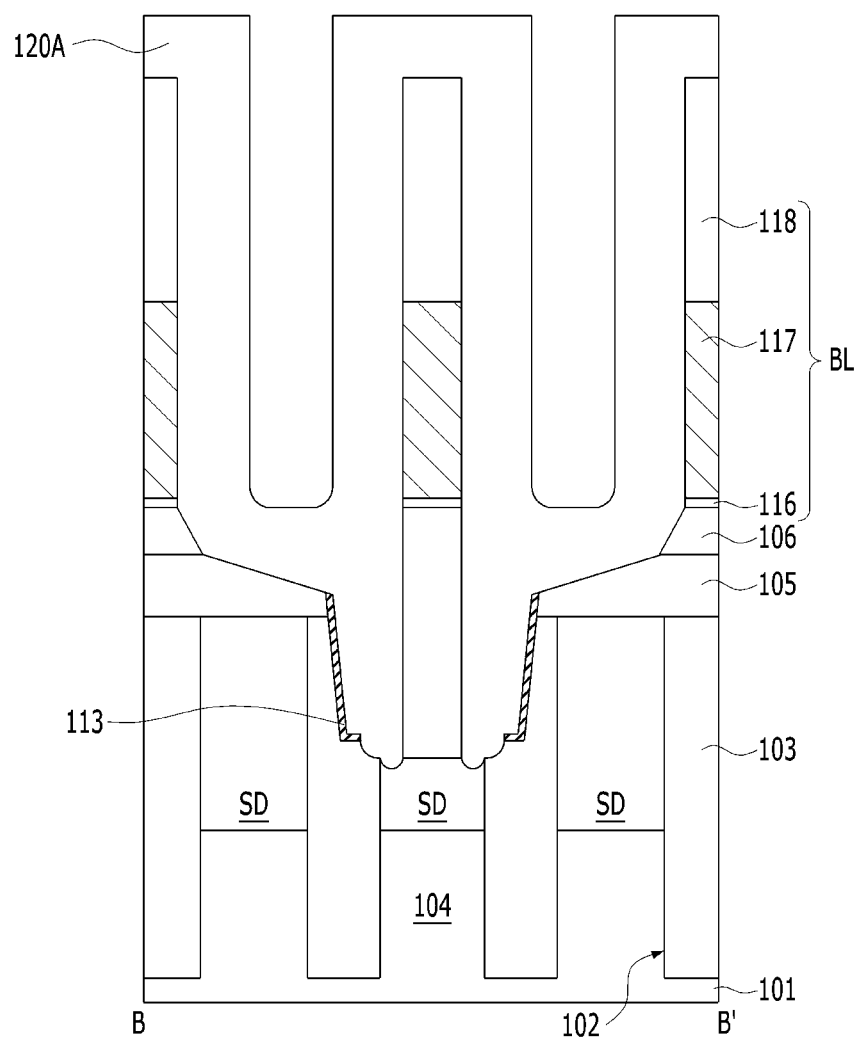
FIGS. 7A to 7E illustrate a method for fabricating a semiconductor device in accordance with an embodiment of the present disclosure.

Referring to FIG. 7A, a preliminary bit line spacer 120A may be formed over the bit line structure BL. The preliminary bit line spacer 120A may cover the bit line structure BL, the first and second inter-layer dielectric layers 105 and 106, and the first spacer 113.

The preliminary bit line spacer 120A may be formed of a dielectric material. The preliminary bit line spacer 120A may include a low-k material. The preliminary bit line spacer 120A may include an oxide or a nitride. The preliminary bit line spacer 120A may include, for example, silicon oxide, silicon nitride, or a metal oxide. The preliminary bit line spacer 120A may include $SiO_2$, $Si_3N_4$, or SiN. The preliminary bit line spacer 120A may include a multi-layer spacer. The preliminary bit line spacer 120A may include an air gap (not shown). Accordingly, a pair of line-type air gaps may be formed on both sidewalls of the bit line structure BL. The pair of line-type air gaps may be symmetrical. In some embodiments, the multi-layer spacer may include a first spacer, a second spacer, and a third spacer, the third spacer may be positioned between the first spacer and the second spacer. The multi-layer spacer may include a NON structure in which an oxide spacer is positioned between nitride spacers. According to an embodiment, the multi-layer spacer may include a first spacer, a second spacer, and an air gap between the first spacer and the second spacer.

According to an embodiment, a gap-fill material may be formed between the preliminary bit line spacer 120A and the first spacer 113. The upper surface of the gap-fill material may be positioned at the same level as the upper surface of the first spacer 113. The preliminary bit line spacer 120A may be formed over the gap-fill material. The gap-fill material may include a dielectric material.

Figure 7B:
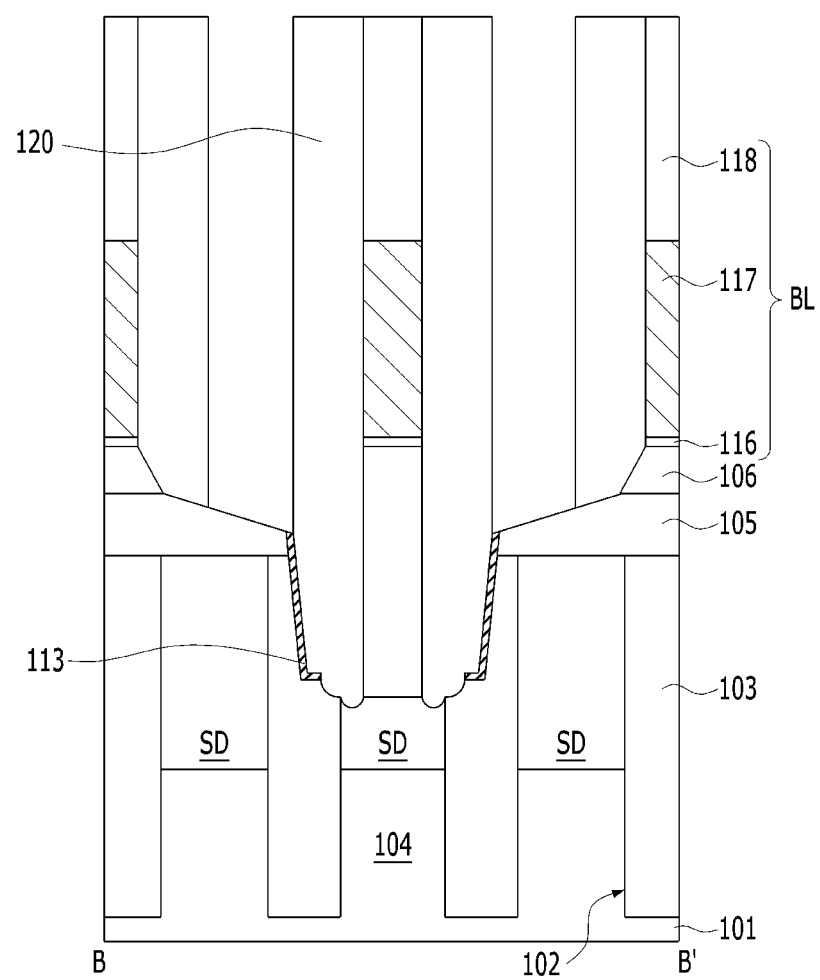

Referring to FIG. 7B, a bit line spacer 120 may be formed by etching the preliminary bit line spacer 120A. The bit line spacer 120 may be formed on both sidewalls of the bit line structure BL. The upper surface of the bit line spacer 120 may be positioned at the same level as the upper surface of the bit line structure BL.

Figure 7C:
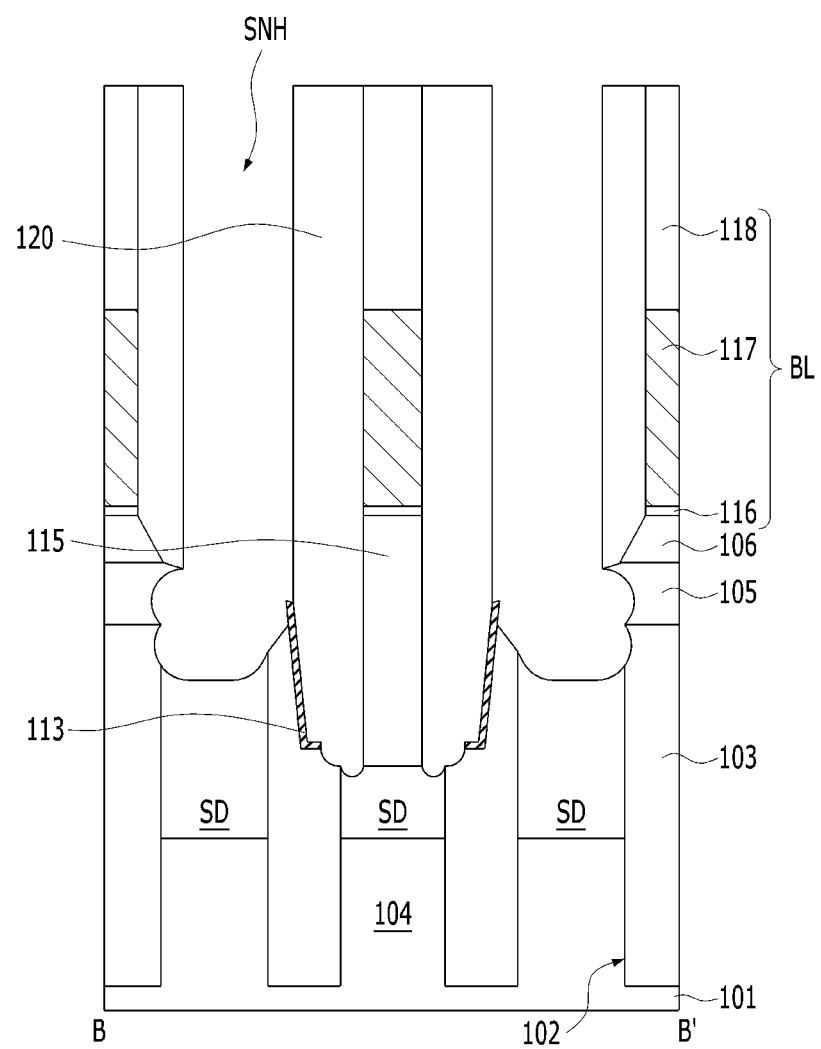

Referring to FIG. 7C, a storage node contact opening SNH may be formed between the bit line structures BL. The bottom surface of the storage node contact opening SNH may extend into the substrate 101. During formation of the storage node contact opening SNH, the isolation layer 103, the first and second inter-layer dielectric layers 105 and 106, and the source/drain regions SD may be recessed to a predetermined depth. A portion of the substrate 101 may be exposed by the storage node contact opening SNH. The lower surface of the storage node contact opening SNH may be positioned at a lower level than the upper surface of the substrate 101. The bottom surface of the storage node contact opening SNH may be positioned at a higher level than the bottom surface of the bit line contact plug 115.

Deep-out and trimming processes may be performed to form the storage node contact opening SNH. The storage node contact opening SNH may be formed without loss of the bit line spacer 120 as a result of the deep-out process. Side and lower areas of the storage node contact opening SNH may be expanded by the trimming process. The first and second inter-layer dielectric layers 105 and 106 and a portion of the substrate 101 may be removed by the trimming process. The lower portion of the storage node contact opening SNH may extend in a lateral direction to have a bulb shape.

Figure 7D:
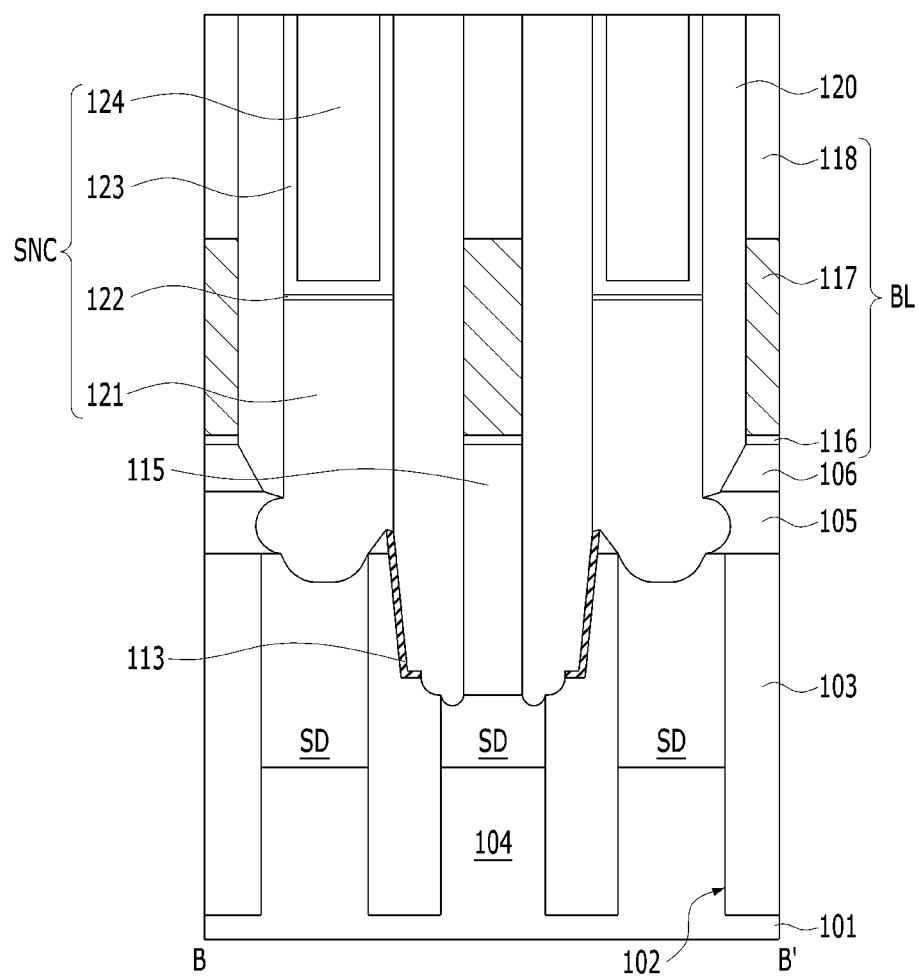

Referring to FIG. 7D, a storage node contact plug SNC may be formed. The storage node contact plug SNC may include a lower plug 121, an ohmic contact layer 122, a conductive liner 123, and an upper plug 124. The conductive liner 123 may be selectively omitted. The storage node contact plug SNC may contact the first spacer 113. Accordingly, the first spacer 113 may include a first dielectric material contacting the storage node contact plug SNC and a second dielectric material contacting the second spacer, and the first dielectric material and the second dielectric material may be continuous with each other.

The lower plug 121 may be formed over the substrate 101. The bit line spacer 120 may be positioned between the bit line 117 and the lower plug 121. The bottom surface of the lower plug 121 may be coupled to the source/drain area SD. The upper surface of the lower plug 121 may be positioned at a lower level than the upper surface of the bit line 111. The lower plug 121 may include a silicon-containing material. The lower plug 121 may be doped with an impurity. The lower plug 121 may include doped-silicon e.g., doped with an impurity.

An ohmic contact layer 122 may be formed on the lower plug 121. The ohmic contact layer 122 may include, for example, a metal silicide. The ohmic contact layer 122 may include cobalt silicide (CoSix). According to an embodiment, the ohmic contact layer 122 may include cobalt silicide of a 'CoSi$_2$ phase'.

A conductive liner 123 may be formed on an upper surface of the ohmic contact layer 122 and a portion of a side surface of the bit line spacer 120. The conductive liner 123 may be selectively omitted. The conductive liner 123 may include, for example, a metal or a metal nitride. The conductive liner 123 may include, for example, titanium (Ti), titanium nitride (TiN), titanium silicon nitride (TiSiN), tantalum (Ta), tantalum nitride (TaN), tungsten nitride (WN), or a combination thereof.

An upper plug 124 may be formed on the conductive liner 123. The upper plug 124 may include a conductive material. The upper plug 124 may include, for example, a metal-containing material. The upper plug 124 may include one or more among gold (Au), silver (Ag), copper (Cu), aluminum (Al), nickel (Ni), tungsten (W), titanium (Ti), platinum (Pt), palladium (Pd), tin (Sn), lead (Pb), zinc (Zn), indium (In), cadmium (Cd), chromium (Cr), and molybdenum (Mo). According to an embodiment, the upper plug 124 may include, for example, tungsten (W)-containing material. The upper plug 124 may include, for example, tungsten (W).

Figure 7E:
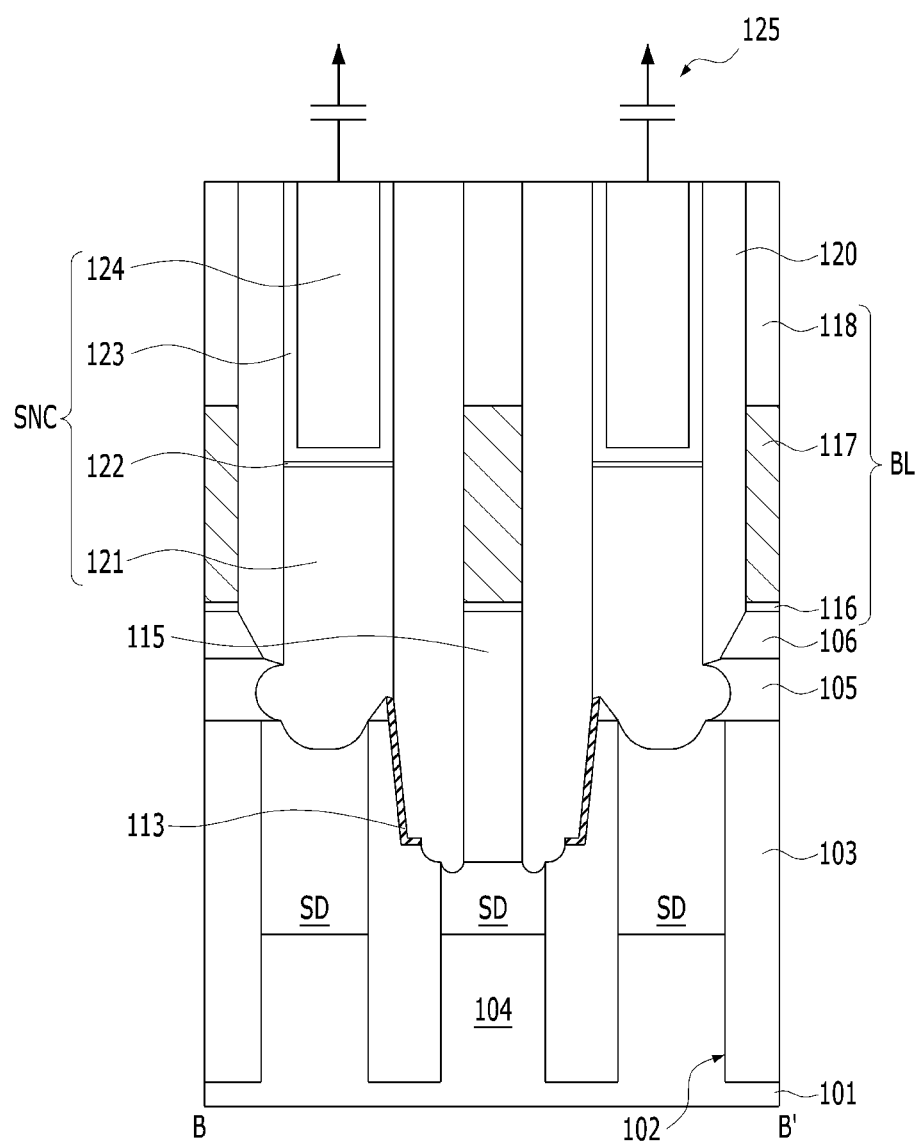

Referring to FIG. 7E, the storage node 125 may be formed over the upper plug 124. The storage node 125 may have a cylinder shape, a pillar shape, or a combination of a cylinder shape and a pillar shape. The storage node 125 may include a lower electrode, a dielectric layer, and an upper electrode. The lower electrode and the upper electrode may include, for example, a metal layer, a metal nitride, or a combination thereof. For example, the lower electrode and upper electrode may include cobalt (Co), titanium (Ti), nickel (Ni), tungsten (W), molybdenum (Mo), platinum (Pt), ruthenium (Ru), iridium (Ir), titanium nitride (TiN), titanium silicon nitride (TiSiN), titanium aluminum nitride (TiAlN), tantalum nitride (TaN), tantalum silicon nitride (TaSiN), tantalum aluminum nitride (TaAlN), tungsten nitride (WN), or a combination thereof. The dielectric layer may include at least one selected from among zirconium oxide, aluminum oxide, and hafnium oxide. The dielectric layer may include a ZAZ structure in which a first zirconium oxide, aluminum oxide, and a second zirconium oxide are stacked.

According to the above-described embodiment, by forming the first spacer 113, the dopant of the bit line contact plug 115 may not flow into the substrate 101. Accordingly, it is possible to prevent a defect in the properties of the semiconductor device that may be caused by the dopant. Also, by forming the first spacer 113, it is possible to prevent additional etching of the substrate 101 when the bit line contact plug 115 is formed. Accordingly, the gaps G1 and G2 formed on both sidewalls of the bit line contact plug 115 may be filled without voids in the subsequent process. Therefore, a short circuit defect of the bit line contact plug 115 may be eliminated.

Also, the first spacer 113 may be protected by forming the second spacer 114, when the bit line contact plug 115 is formed. When the bit line contact plug 115 is formed due to the second spacer 114, the etching rate may be increased. As the second spacer 114 is formed, the area of the gaps G1 and G2 may be increased. Accordingly, a portion of the second spacer 114 not overlapping with the bit line structure BL may be reduced. Therefore, a short circuit defect of the bit line contact plug 115 may be improved.

According to an embodiment, a dopant of a contact plug may not flow in a substrate by forming a first spacer. Accordingly, property defects of the semiconductor device may be improved.

According to an embodiment, when the contact plug is formed, it is possible to protect the substrate from being additionally etched by forming the first spacer. Therefore, it is possible to improve a short circuit defect of the contact plug.

According to an embodiment, the first spacer may be protected by forming a second spacer.

According to an embodiment, by forming the second spacer, the etching rate may be increased when the contact plug is formed, and the area of a gap may be secured. Therefore, it is possible to improve a short circuit defect of the contact plug.

While the present invention has been described with respect to specific embodiments, it will be apparent to those skilled in the art that various changes and modifications may be made without departing from the spirit and scope of the disclosure as defined in the following claims.

What is claimed is:

1. A semiconductor device, comprising:
    a bit line structure including a bit line contact plug over a substrate and a bit line formed in a first direction over the bit line contact plug;
    a storage node contact plug formed over the substrate spaced apart from the bit line structure;
    a first spacer between the bit line structure and the storage node contact plug; and a pair of second spacers formed at both ends of the bit line contact plug and separated from each other in the first direction.

2. The semiconductor device of claim 1, wherein the bit line extends in the second direction while covering the bit line contact plug and the second spacer.

3. The semiconductor device of claim 1, wherein the bit line contact plug and the second spacer include polysilicon.

4. The semiconductor device of claim 1, wherein the bit line contact plug includes doped silicon, and
the second spacer includes undoped silicon.

5. The semiconductor device of claim 1, wherein the bit line contact plug includes doped polysilicon, and
the second spacer includes one of amorphous silicon, undoped polysilicon, silicon germanium (SiGe), and titanium nitride (TiN).

6. The semiconductor device of claim 1, wherein the first spacer includes an oxide, a nitride, or a combination thereof.

7. The semiconductor device of claim 1, wherein the first spacer includes:
a first dielectric material in contact with the storage node contact plug; and
a second dielectric material in contact with the second spacer, and,
the first dielectric material and the second dielectric material are in continuum.

8. The semiconductor device of claim 1, wherein the storage node contact is arranged between the bit line structure and a neighboring bit line structure.

9. The semiconductor device of claim 8, wherein the storage node contact has a part which is vertically overlapped with a part of the bit line contract plug over the substrate.

10. The semiconductor device of claim 1, wherein the storage node contact is separated from neighboring storage node contacts in both the first direction and a second direction that is perpendicular to the first direction.

11. The semiconductor device of claim 1, wherein the bit line contact plug includes doped silicon, and
the second spacer includes undoped silicon.

12. The semiconductor device of claim 1, wherein the bit line contact plug includes doped polysilicon, and
the second spacer includes one of amorphous silicon, undoped polysilicon, silicon germanium (SiGe), and titanium nitride (TiN).

13. A semiconductor device, comprising:
a bit line structure including a bit line contact plug over a substrate and a bit line over the bit line contact plug;
a storage node contact plug formed over the substrate spaced apart from the bit line structure in a first direction;
a first spacer between the bit line structure and the storage node contact plug; and
a pair of second spacers formed at both ends of the bit line contact plug in a second direction that is perpendicular to the first direction,
wherein the bit line contact plug and the second spacer include polysilicon.

14. The semiconductor device of claim 13, wherein the bit line extends in the second direction while covering the bit line contact plug and the second spacer.

15. The semiconductor device of claim 13, wherein the first spacer includes an oxide, a nitride, or a combination thereof.

16. The semiconductor device of claim 13, wherein the first spacer includes:
a first dielectric material in contact with the storage node contact plug; and
a second dielectric material in contact with the second spacer, and,
the first dielectric material and the second dielectric material are in continuum.

17. The semiconductor device of claim 13, wherein the second spacers are oppositely separated from each other.

* * * * *